United States Patent [19]

Merrill et al.

[11] Patent Number: 5,459,174
[45] Date of Patent: Oct. 17, 1995

[54] RADIATION CURABLE ISOOLEFIN COPOLYMERS

[76] Inventors: Natalie A. Merrill, 695 Pineloch #1203, Webster, Tex. 77598; Hsian-Chang Wang, 14 Whittier, Edison, N.J. 08820; Anthony J. Dias, 1411 Quiet Green Ct., Houston, Tex. 77062

[21] Appl. No.: 211,899

[22] Filed: Oct. 19, 1992

[86] PCT No.: PCT/US92/08930

§ 371 Date: Jun. 24, 1994

§ 102(e) Date: Jun. 24, 1994

[87] PCT Pub. No.: WO93/08220

PCT Pub. Date: April 29, 1993

Related U.S. Application Data

[63] Continuation-in-part of Ser. No. 779,177, Oct. 17, 1991, abandoned, which is a continuation-in-part of Ser. No. 441,575, Nov. 22, 1989, abandoned, Ser. No. 442,028, Nov. 27, 1989, Pat. No. 5,162,445, Ser. No. 631,610, Dec. 20, 1990, abandoned, and Ser. No. 633,645, Dec. 20, 1990, abandoned, said Ser. No. 441,575, Ser. No. 442,028, Ser. No. 631,610, and Ser. No. 633,645, each , is a continuation-in-part of Ser. No. 199,665, May 27, 1988, abandoned, Ser. No. 416,503, Oct. 3, 1989, abandoned, and Ser. No. 416,713, Oct. 3, 1989, abandoned.

[51] Int. Cl.⁶ ................................................. C08F 255/08
[52] U.S. Cl. ...................... 522/35; 522/33; 522/46; 522/120; 522/121; 522/132; 522/149; 522/904; 522/905; 525/70; 525/71; 525/72; 525/73; 525/76; 525/87; 525/301; 525/301.5; 525/333.4; 427/507; 427/520; 524/576
[58] Field of Search ........................... 525/63, 70, 71, 525/72, 73, 76, 87, 301, 301.5, 333.4, 355, 356, 383, 384; 522/35, 33, 46, 120, 121, 132, 149, 904, 905; 524/576; 427/35, 42, 54.1, 208.4

[56] References Cited

U.S. PATENT DOCUMENTS

| | | | |
|---|---|---|---|
| 2,802,812 | 8/1957 | Overberger | 526/347 X |
| 3,455,890 | 7/1969 | Davidson | 526/347.1 X |
| 4,315,998 | 2/1982 | Neckers et al. | 525/333.4 X |
| 5,162,445 | 11/1992 | Powers et al. | 525/333.4 |
| 5,376,503 | 12/1994 | Audett et al. | 522/35 X |

FOREIGN PATENT DOCUMENTS

1341004  12/1973  United Kingdom.

OTHER PUBLICATIONS

Hackh's Chemical Dictionary, 4th Ed., McGraw–Hill Co., N.Y., 27, 1969.

*Primary Examiner*—Fred Teskin
*Attorney, Agent, or Firm*—Myron B. Kurtzman; C. L. Bell

[57] ABSTRACT

A radiation curable functionalized polymer is disclosed. The functionalized polymer is a copolymer of an isoolefin of 4 to 7 carbon atoms and para-alkylstyrene, wherein the para-alkylstyrene is functionalized with an acrylate or a mixture of acrylates and/or a photosensitizer and/or other functional groups at the para-alkyl groups of the para-alkylstyrene.

36 Claims, 9 Drawing Sheets

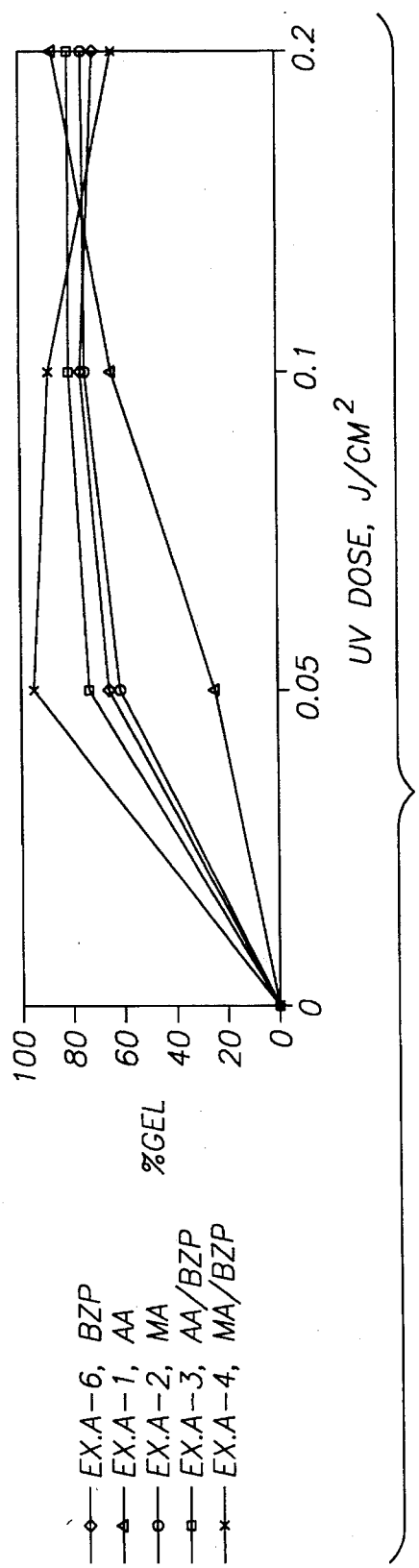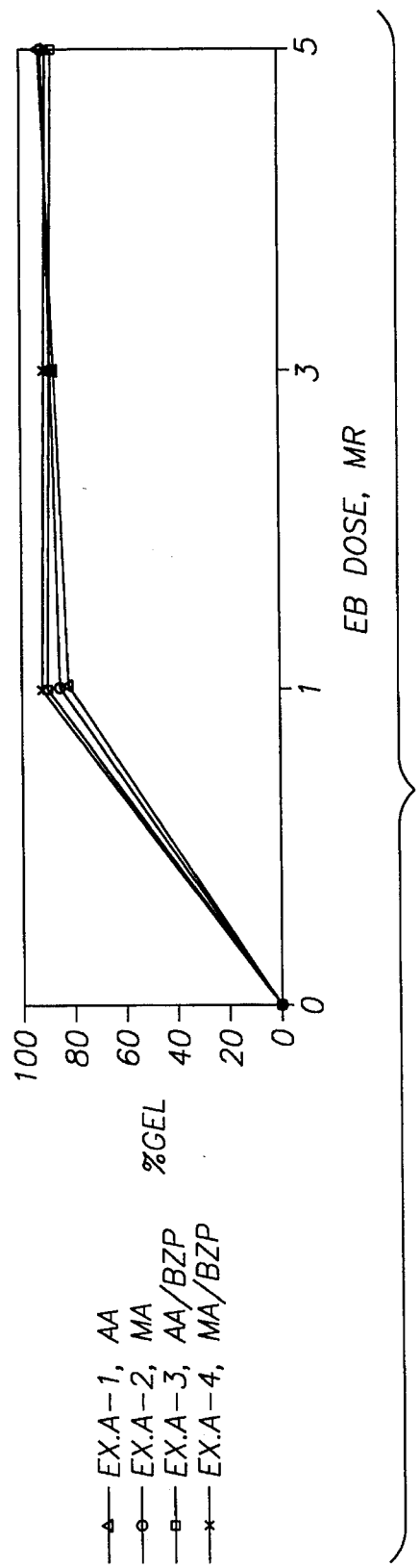

1

RADIATION CURABLE ISOOLEFIN COPOLYMERS

CROSS-REFERENCE TO RELATED APPLICATIONS

This application is a 371 of PCT/US92/08930, filed Oct. 19, 1992, and a continuation in part of U.S. Ser. No. 779,177, (now abandoned) filed Oct. 17, 1991 which is in turn a continuation-in-part of U.S. Ser. Nos. 441,575, (now abandoned) filed Nov. 22, 1989; 442,028, (now U.S. Pat. No. 5,162,445) filed Nov. 27, 1989; 631,610, (now abandoned) filed Dec. 20, 1990; and 633,645, (now abandoned) filed Dec. 20, 1990; which are in turn continuations-in-part of U.S. Ser. Nos. 199,665, (now abandoned) filed May 27, 1988; 416,503, (now abandoned) filed Oct. 3, 1989; and 416,713, (now abandoned) filed Oct. 3, 1989. All of the above applications are herein incorporated by reference as if fully set forth.

FIELD OF THE INVENTION

This invention relates to compositions containing radiation reactive functionalized copolymers of isoolefin and para-alkylstyrene, and more particularly, this invention relates to such copolymers wherein the para-alkylstyrene is functionalized with an acrylate and optionally further containing photosensitive and or other functionality.

BACKGROUND OF THE INVENTION

The use of radiation-sensitive functionality to induce crosslinking of a polymeric material is an advancing art. Incorporating radiation crosslinkable functionality into elastomeric polymers is desirable since elastomers containing such functionality could be utilized to produce solvent free products and processes including but not limited to pressure-sensitive adhesives (PSA's), coatings, laminates, membranes sealants and lithographic applications. Such radiation cured polymers exhibit cohesive strength, and enhanced resistance to temperature, abrasion, solvents and ozone.

Applications or methods employing external, added or blended crosslinking reagents have inherent difficulties. Added reagents can be toxic and/or volatile and can present manufacturing difficulties and hazards. A crosslinking agent that is incompatible with the elastomeric backbone may also hinder effective crosslinking. Reactive unsaturation sites in the polymeric backbone can facilitate external free-radical crosslinking, but depending on the polymer, the unsaturation also provides sites at which the backbone can be degraded by reactions involving radicals.

It is desirable to have pressure-sensitive adhesives and coatings which are curable without the use of these additive compounds yet have saturated polymeric backbones which are not degraded in reactions involving radicals. To this end, radiation-reactive crosslinking agents may alternatively be incorporated into the polymer backbone, for instance, by copolymerizing with a radiation-sensitive vinyl polymerizable comonomer. However, preparing such comonomers on a large scale is generally difficult. Radiation-reactive functionality may also be grafted onto the polymer backbone in a post-polymerization step, however, the resulting polymer is typically a heterogeneous product of low yield due to the difficulty of achieving adequate molecular contact at desired reaction sites. A good discussion of the mechanisms of photochemical reactions in polymers and examples of photoinitiators may be found in J. F. Rabek, "Mechanisms of Photophysical Processes and Photochemical Reactions in Polymers, Theory and Applications," Chapters 11 and 12, J. Wiley & Sons, 1987, which is hereby incorporated herein by reference.

U.S. Pat. Nos. 4,188,215 to Sato et al.; 3,923,703 to Fukutani et al.; 3,867,318 to Nishikubo et al.; 3,694,383 to Azami et al.; and 3,560,465 to Reynolds; and U.K. Patent 1,341,004 all relate to polymeric resins incorporating photosensitive functionality and/or processes for making such resins. These photosensitive resins are generally useful in photographic films.

Photosensitive coatings comprising a blend of a polymer and a photosensitive crosslinking agent are disclosed in U.S. Pat. No. 3,867,271 to Malatesta, et al. In this patent, a conjugated diene containing Butyl rubber is cured by ultraviolet radiation with the aid of certain photosensitizers. A similar composition said to be useful as a coating for glass substrates is disclosed in U.S. Pat. No. 4,086,373 to Tobias et al., as comprising at least a rubbery thermoplastic organic polymer and an organic photosensitizer.

Photosensitive vinyl monomers are disclosed in U.S. Pat. Nos. 3,429,852 and 3,574,617 both to Skoultchi, wherein ethylenically unsaturated derivatives of substituted benzophenones are prepared by a method involving reacting a substituted benzophenone with an ethylenically unsaturated reagent such as glycidyl acrylate or glycidyl methacrylate. The resulting monomers may thereafter be homo- or copolymerized with a variety of conventional ethylenically unsaturated, i.e. vinyl, monomers. Photosensitive coating systems are prepared by depositing a solid polymer from an organic solvent or an emulsion onto a substrate. The photosensitive coating are said to be particularly suitable for use in various applications including, for example, lithography and chemical milling.

A similar concept is disclosed in U.S. Pat. No. 4,148,987 to Winey, wherein monoethylenically unsaturated derivatives of substituted benzophenones or acetophenones are prepared by a reaction of the benzophenone or acetophenone with a vinyl benzyl halide. These derivatives are polymerizable to form homopolymers, or copolymers with a wide variety of conventional ethylenically unsaturated monomers. The resulting polymers are sensitive to radiation, such as ultraviolet light having a wavelength of 2,000 to 5,000 Angstroms, and readily crosslink or cure upon exposure to such radiation. Adhesives, binders, coatings and impregnating compositions are made from the polymers.

Radiation-sensitive functionality has also been used to induce crosslinking of a polymeric material in the printing industries where printing plates are initially coated with polymers having light sensitivity. Such radiation-crosslinkable polymers have also been widely used as photoresists in the manufacture of semi-conductors or other engraved articles.

The chemical modification of poly(vinylbenzylchloride) with a photosensitive compound including p-hydroxybenzophenone, 2-hydroxyfluorenone, potassium carbazole, and the like is disclosed in Bailey, et al., *Journal of Applied Polymer Science: Polymer Chemistry Edition*, vol. 17, 777–782 (1979).

In commonly assigned U.S. Ser. No. 441,575, filed Nov. 22, 1989, which is also a continuation-in-part of co-pending U.S. Ser. No. 416,503 filed Oct. 3, 1989, which is a continuation-in-part of co-pending U.S. Ser. No. 199,665 filed May 27, 1988; and co-pending U.S. Ser. No. 416,713 filed Oct. 3, 1989, which is a continuation-in-part of U.S. Ser. No. 199,665 filed May 27, 1988, the disclosures of which are hereby incorporated by reference, it was theorized that the introduction of controlled amounts of the desired specific functionality as pendant groups on the saturated hydrocarbon backbone would greatly extend usefulness by permitting these polymers to be adhered to other surfaces and/or to be co-reacted with or compatibilized with other functional polymers by "grafting" or crosslinking reactions. It was further theorized that the introduction of pendant functionality of the right type and amounts would permit these saturated hydrocarbon polymers to be "painted" or coated with or on other materials, and/or to be laminated with or dispersed in other materials to yield composite materials with a desired combination of properties.

Commonly assigned U.S. Ser. No. 442,028, filed Nov. 27, 1989, and U.S. Ser. Nos. 631,610 and 633,645, both filed Dec. 20, 1990, all of which are incorporated herein by reference, disclose radiation reactive functionalized copolymers comprising an isoolefin having about 4 to about 7 carbon atoms and a para-alkylstyrene, wherein a radiation-reactive functional group is attached to the para-alkyl group of the para-alkylstyrene.

Previous workers have not applied nucleophilic substitution reactions to isobutylene/para-methyl-styrene/para-bromomethylstyrene terpolymers to produce versatile, thermally stable, radiation curable, substantially backbone-saturated, pendant acrylate/photosensitizer-functionalized, soluble copolymers.

SUMMARY OF THE INVENTION

The present invention is, in one aspect, the discovery of radiation curable copolymers having acrylate-functionality and photosensitive functionality. These polymers can be formed into -adhesives, films, laminates, membranes and molded articles among other things. The term "radiation curable" refers to the crosslinking of the copolymer through exposure to radiation such as ultraviolet (UV), electron beams (EB), gamma, visible, microwave, and like radiation. The radiation curable copolymer comprises a copolymer of an isoolefin of 4 to 7 carbon atoms and a para-alkylstyrene wherein acrylate and photosensitive functional groups are substituted on the para-alkyl group. In one preferred embodiment, the isoolefin comprises isobutylene, and the para-alkylstyrene comprises para-methylstyrene and/or radiation-curable functionalized para-methylstyrene. The copolymer can be internally crosslinked utilizing UV or EB radiation. Quite surprisingly, it has been found that the acrylate-functionalized copolymer can be crosslinked at very low radiation levels without any photoinitiator or photosensitizer. The shelf life and open pot time of such acrylate functionalized copolymer is short. It is typically necessary to add antioxidants, such as BHT, to increase this time. Unfortunately the presence of the antioxidant can compromise the radiation response. However, when a hydrogen-abstracting photoinitiator is present, either blended with the copolymer or grafted thereto, the copolymer is also surprisingly, thermally stabilized and has enhanced adhesive properties after it is radiation cured. In particular, the copolymer with photosensitive group additionally grafted thereto is thermally stable above 80 degrees C., preferably stable to 130 degrees C. for at least two, preferably 3 months.

Thus, the present invention provides a radiation-reactive acrylate-functionalized and photosensitive functionalized copolymer. The copolymer comprises an isoolefin having from 4 to 7 carbon atoms and a para-alkylstyrene wherein the copolymer has a number average molecular weight ($M_n$) of at least about 5000, preferably from about 5000 to about 500,000 or greater, and more preferably from about 50,000 to about 300,000. The radiation-reactive functionalized copolymers also preferably have a ratio of weight average molecular weight ($M_w$) to $M_n$ of less than about 6, more preferably less than about 4, most preferably less than about 2.5. The preferred copolymers are elastomeric, radiation-reactive, acrylate-functionalized copolymers, comprising isoolefin between about 80 and 99.5 percent by weight of the copolymer and para-alkylstyrene between about 0.5 and 20 percent by weight of the copolymer, with the acrylate-functionalized para-alkylstyrene comprising between about 0.5 and 55 mole percent of the para-alkylstyrene. In accordance with another embodiment, however, where glassy or plastic materials are being produced as well, the radiation-reactive functionalized copolymers comprise isoolefin between about 10 and 99.5 percent by weight of the copolymer, para-alkylstyrene between about 0.5 and 90 percent by weight of the copolymer and acrylate-functionalized para-alkylstyrene between about 0.5 and 55 percent by weight of the polymer.

In accordance with a preferred embodiment, the radiation-reactive, acrylate-functionalized and photosensitive functionalized copolymers include the para-alkylstyrene having an acrylate functional group affixed to the alkyl group as:

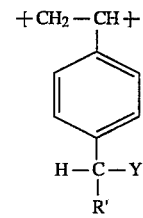

wherein R and R' are independently selected from hydrogen, alkyl, and the primary and secondary alkyl halides, and Y is an acrylate group of the formula:

wherein R" is hydrogen or alkyl of from 1 to about 20 carbon atoms, and R'" is R" or unsaturated alkyl of from 1 to about 20 carbon atoms. Preferably, Y is an acrylate moiety having from 3 to 8 carbon atoms. Preferably, these radiation-reactive functionalized copolymers are otherwise substantially free of any additional functional groups in the form of any ring functional groups or any functional groups on the polymer backbone chain (i.e., on the isoolefin carbons).

A precursor copolymer of isoolefin having between 4 and 7 carbon atoms and the para-alkylstyrene used for preparation of the radiation functionalized copolymers described above is formed by admixing the isoolefin and the para-alkylstyrene in a copolymerization reactor under copolymerization conditions in the presence of a diluent, and a Lewis acid catalyst, and maintaining the copolymerization reactor substantially free of impurities which can complex with the catalyst or which can copolymerize with the isoolefin or the para-alkylstyrene. In this manner, precursor copolymers for making the above-described radiation functionalized copolymers are produced as direct reaction products, which, in their as-polymerized form, have a substantially homogeneous compositional distribution, and which can also comprise isoolefin and para-alkylstyrene, and have a number average molecular weight of greater than about 5000. The isobutylene/para-methylstyrene precursor copolymer

[throughout the remainder of this application the use of applicants' preferred embodiment of isobutylene and para-methylstyrene is intended to also include the potential use of various isoolefins and para-alkylstyrenes (as set forth above)] is insoluble in the preferred diluent, and the process is thus a slurry polymerization process. In another embodiment, however, in which the isobutylene/para-methylstyrene precursor copolymer is soluble in the diluent, a solution polymerization process is described.

The precursor copolymer of the isoolefin and the para-alkylstyrene is then partially selectively brominated to yield a "base terpolymer" containing benzylic bromine functionality. The base terpolymer is produced by selective bromination of one of the benzylic hydrogens of the copolymer of an isoolefin having 4 to 7 carbon atoms and a para-alkylstyrene having the formula:

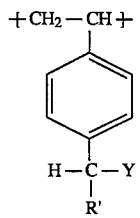

in the presence of bromine and a radical initiator so as to provide a brominated copolymer of isoolefin and para-alkylstyrene which copolymer includes the para-alkylstyrene as:

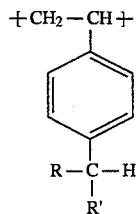

or as:

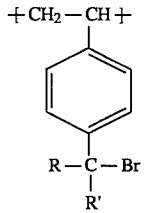

or as a mixture of (1) and (2), in which R and R' are independently selected from hydrogen, alkyl, and the primary and secondary alkyl halides, and in which the copolymer is otherwise substantially free of ring bromine or any bromine on the polymer backbone chain. In accordance with one embodiment of the selective bromination process the radical initiator is light or heat. In accordance with another embodiment the radical initiator has a half-life of between about 5 and 2500 minutes, and preferably comprises a bis azo compound.

Substitution of radiation-reactive acrylate-functional groups for the benzylic bromine which is a very active and versatile electrophile can be accomplished by nucleophilic substitution reactions to introduce the desired acrylate functionality, and optionally, one or more additional functionalities.

The pendant radiation-reactive acrylate-functionalized copolymers can be characterized as a radiation-reactive, nucleophilically substituted, halogenated copolymer of an isoolefin and para-alkylstyrene which copolymer includes the para-alkylstyrene as:

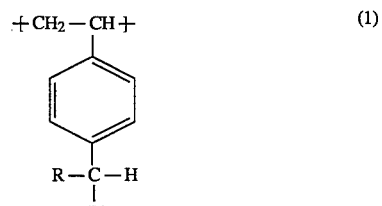

or as:

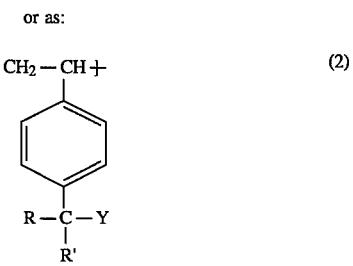

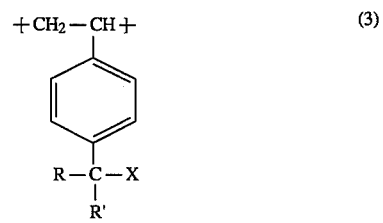

or as:

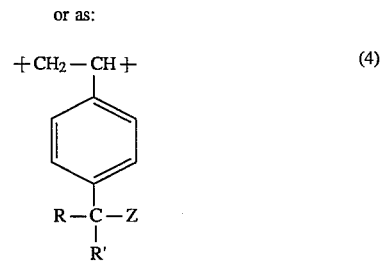

or as a mixture of (1), (2), and/or (3) and/or (4); wherein R and R' are independently selected from the group consisting of hydrogen, alkyl, preferably $C_1$ to $C_5$ alkyl, and primary or secondary alkyl halides, preferably primary or secondary $C_1$ to $C_5$ alkyl halides; X is selected from the group consisting of chlorine and bromine, preferably bromine; Y represents a new acrylate functional group or functional groups, preferably attached to the polymer via nucleophilic substitution of one of the benzylic halogens; and Z represents an optional additional functional group or groups, other than the acrylate group, attached to the polymer via nucleophilic substitution of one of the benzylic halogens which may be radiation or non-radiation reactive. In a preferred embodiment, the copolymer includes a hydrogen-abstracting photoinitiator or photosensitizer in a relatively minor proportion, e.g. as low as 1 ppm up to 3 weight percent, preferably from about 100 to about 5000 ppm, and especially from about 1000 to about 2500 ppm. The photoinitiator can be simply intimately blended with the copolymer, but is preferably grafted thereto, as a photosensitive Z group.

In another aspect, the present invention provides compositions comprising acrylate and photosensitive functionalized copolymers. The adhesive composition preferably comprises a blend of the acrylate and photosensitive functionalized copolymer and a tackifier. The adhesive can be a pressure-sensitive adhesive (PSA), i.e. the composition is tacky at ambient temperatures. These PSA compositions are internally or inherently curable by UV or EB radiation, preferably essentially free of added photoinitiator and crosslinking promoter, the presence of which are common problems in the manufacture of the prior art PSA applications. The present PSA's can be applied as hot melt coatings where subsequent crosslinking by radiation crosslinking provides cohesive strength, toughness, temperature resistance, solvent resistance, abrasion resistance and resistance to ozone degradation.

Yet another aspect of the invention provides a coated article having a surface having coated on at least a portion thereof a radiation curable PSA composition comprising a copolymer of an isoolefin of 4 to 7 carbon atoms such as isobutylene and a radiation-reactive, acrylate-functionalized para-alkylstyrene such as para-methylstyrene, and optionally, a tackifier.

Yet a further aspect of the invention provides a method for making an article coated with a radiation curable PSA which comprises the steps of coating at least a portion of a surface of the article with the radiation curable PSA described above, and exposing the coated article surface to radiation to effect crosslinking of the polymer adhesive.

In accordance with a further embodiment of the present invention, a method for making a lithographic, corrosion resistant or other coating comprises the steps of coating at least a portion of a surface of an article with a composition comprising radiation-reactive copolymer recited above and exposing the coating to electromagnetic radiation to induce crosslinking therein. The method may further comprise the steps of forming an image of a pattern on the coating prior to the exposing step to selectively block penetration of the radiation and removing any uncrosslinked coating after the exposing step to reveal the image formed as crosslinked coating. The method may further comprise the step of etching the surface of the article after the removing step wherein a pattern mask is formed in the crosslinked coating.

In yet another embodiment of the present invention, a radiation-crosslinked coating composition comprises a crosslinkable radiation-reactive, acrylate and photosensitive functionalized composition as recited above wherein at least a portion thereof is crosslinked by electromagnetic radiation. The crosslinked coating may be useful as a PSA, as printing elements and etch masks or corrosion resistant, solvent resistant, shatterproofing and other type coatings.

Other embodiments of the present invention include various articles comprising at least a portion thereof the radiation-crosslinked coating composition of the present invention as recited above.

BRIEF DESCRIPTION OF THE DRAWINGS

FIG. 11 is a graph comparing the UV gel response of Example A-1 to A-4 and A-6 terpolymer derivatives.

FIG. 12 is a graph comparing the EB gel response of Example A-1 to A-4 terpolymer derivatives.

DETAILED DESCRIPTION OF THE INVENTION

Figure 1:
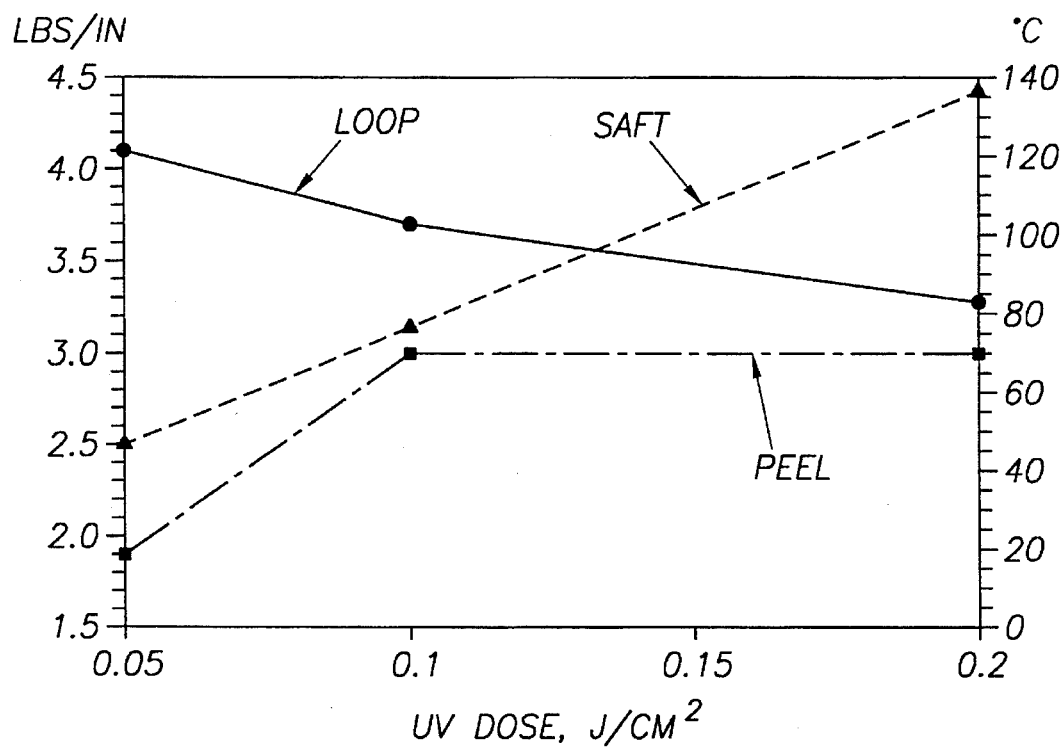
FIG. 1 is a graph of adhesive performance properties SAFT (°C.) (1"x1"x1 kg), 180° Peel (lbs/in.) (12 in/min) and Loop Tack (lbs/in.) against UV dose (J/cm$^2$) for Example A-1 acrylic acid functionalized terpolymer formulated with ECR-143H and ECR-111 tackifier.(50:50 :: polymer:resin)
Figure 2:
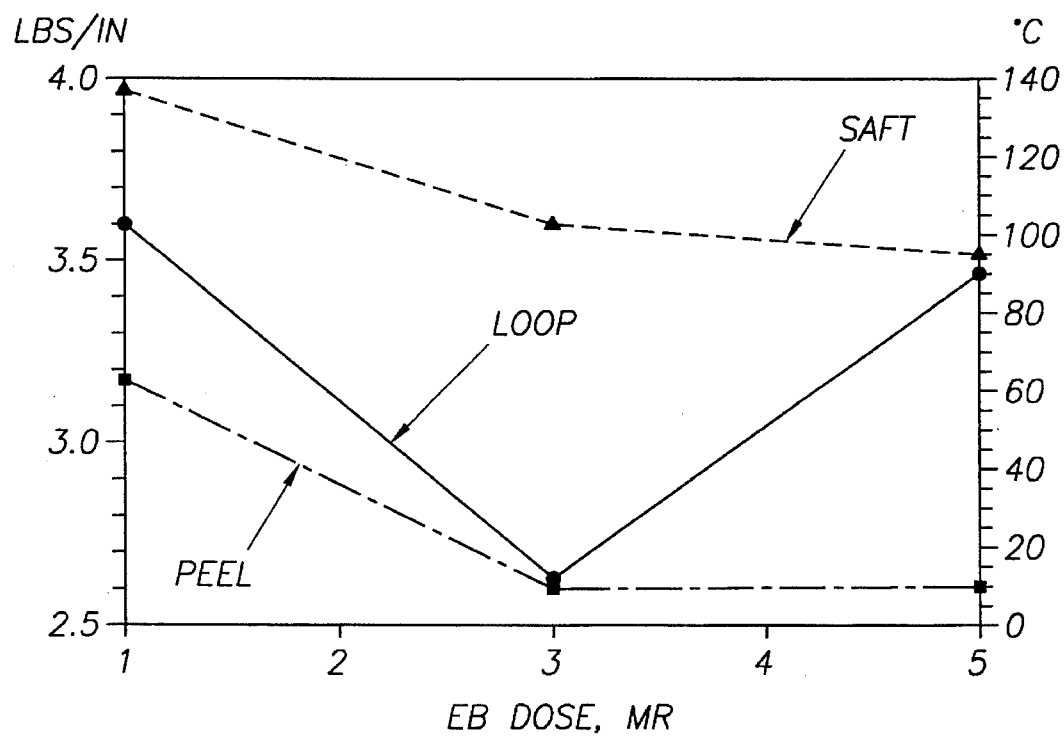
FIG. 2 is a graph of adhesive performance properties SAFT (°C.), 180° Peel (lbs/in.) and Loop Tack (lbs/in.) against EB dose (Mrad) for Example A-1 acrylic acid functionalized terpolymer formulated with ECR-143H and ECR-111 tackifier.

The present composition, preferably as an adhesive, lithographic, corrosion resistant or sealant coating comprises an isobutylene/para-methylstyrene/ para-bromomethylstyrene base terpolymer functionalized with at least one radiation-reactive, acrylate-functional group and one photosensitive group, and can include a tackifier blended therewith.

A. Radiation-Reactive Copolymer

The coating comprises a radiation-reactive copolymer of an isoolefin and para-alkylstyrene including the para-alkylstyrene as:

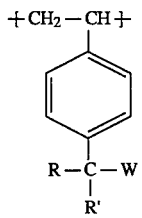

wherein W includes at least Y, and may optionally include a mixture of Y and one or more of hydrogen, X and Z, wherein R, R', X, Y and Z are as defined above The radiation-reactive, acrylate-substituted para-alkylstyrene (wherein W is Y) preferably comprises from about 0.05 to about 5 mole percent of the functionalized copolymer, preferably from about 0.25 to about 1 percent. If too much acrylate is present, the crosslink network formed by subsequent crosslinking may be too tight for adhesive applications, but can be suitable for coatings or lithographic application. Also, too much acrylate results in high thermal reactivity and poor thermal stability which can result in premature crosslinking. Where not enough acrylate is present, sufficient crosslinking may not be obtained.

The unsubstituted para-alkylstyrene (wherein W is hydrogen) may comprise from about 0.5 to about 90 weight percent of the functionalized copolymer, preferably from about 1 to about 20 weight percent and especially from about 2 to about 10 weight percent.

The radically halogenated para-alkylstyrene (wherein W is X) may comprise up to about 55 percent by weight of the copolymer, preferably less than about 20 percent by weight, and more preferably less than about 15 percent by weight of the copolymer. In a preferred embodiment, substantially complete conversion of the halogenated para-alkylstyrene is obtained, for example, by nucleophilic substitution thereof by Y and/or Z groups, so that the radiation-reactive copolymer is essentially free of the halogenated para-alkylstyrene, preferably comprising less than about 1 percent by weight of the functionalized copolymer, more preferably less than about 0.5 percent, most preferably less than about 0.1 percent and especially less than about 0.02 mole percent. Functionalized para-alkylstyrene (wherein W is Z) may be from 0 to about 55 percent by weight of the functionalized copolymer, preferably from 0 to about 20 percent, more preferably from 0 to about 15 percent by weight. Where Z is a hydrogen-abstracting photoinitiator moiety, the functionalized para-methylstyrene wherein W is Z is preferably present so that the photoinitiator substituent comprises from about 1 ppm to about 3 percent by weight of the functionalized copolymer, more preferably from about 100 to about 5000 ppm, and especially from about 1000 to about 2500 ppm.

The remainder of the radiation-reactive copolymer generally comprises the isoolefin which usually ranges from about 10 to about 99.5 weight percent of the radiation-reactive copolymer, preferably from about 80 to about 99 percent by weight, more preferably from about 90 to about 98 weight percent. The $M_n$ of the radiation reactive copolymer is from about 5000 to about 500,000, preferably from about 50,000 to about 300,000 and most preferably from about 50,000 to about 150,000.

The acrylate functionality is derived from an alpha, beta-ethylenically unsaturated carboxylic acid of the formula:

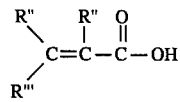

wherein each R" is independently hydrogen or alkyl of up to about 20 carbon atoms, preferably hydrogen, methyl or ethyl, and R''' is hydrogen, alkyl or unsaturated alkyl of up to about 20 carbon atoms, preferably hydrogen or $C_1$-$C_4$ alkyl or alkenyl. The carboxylic acid preferably has from about 8 carbon atoms. Suitable representative examples of carboxylic acids from which the acrylate functionality is derived include acrylic acid, methacrylic acid, methyl methacrylic acid, ethacrylic acid, crotonic acid, isocrotonic acid, tiglic acid, angelic acid, senecioic acid, sorbic acid, and the like. Acrylic acid itself and methacrylic acid are preferred. For purposes of clarity and convenience, the functionality derived from the unsaturated carboxylic acids is collectively referred to as "acrylate" functionality, with the understanding that such reference is inclusive of such acrylic-type acids in addition to acrylic acid itself.

The optionally grafted hydrogen-abstracting photoinitiator moiety can be derived from various compounds reactive by actinic or electron beam radiation. These comprise photoinitiators which can be incorporated into the acrylate-functionalized isobutylene/para-methylstyrene/para-bromomethylstyrene base terpolymer by means of nucleophilic substitution reactions between the benzylic halogen leaving group and the nucleophilic compound containing the photoinitiator moiety. Representative photoinitiators include:

(a) aromatic aldehydes and ketones such as benzophenone, 4-chlorobenzophenone, 4hydroxy-benzophenone, benzoquinone, naphthaquinone, anthraquinone, 2-chloroanthraquinone benzylidene, acetophenone, propiophenone, cyclopropyl phenyl ketone, benzaldehyde, β-napthylphenyl ketone, β-napthaldehyde, β-acetonaphthone, 2,3-pentanedione, benzil, fluorenone, benzanthrone, Michler's ketone, bis(parahydroxybenzylidene)acetone, benzoin, deoxybenzoin, chlorodeoxybenzoin and the like;

(b) alkoxy and acyl substituted aromatic compounds such as 2,2-dimethyloxy-2-phenyl, 1,3,5-triacetyl benzene, 2,5-diethoxy stilbene, and the like;

(c) hetero aromatic compounds such as thioxanthone and the like;

(d) fused ring polycyclic aromatic compounds such as anthracene, pyrene and the like;

(e) nitro aromatic compounds such as, for example, picramide, nitronaphthalene, 5nitro-acenaphthlene, 2-nitrofluorene and the like;

(f) dye compounds such as rose bengal, acridine orange, chlorophyllin, crystal violet, eosin Y, fluorescein, flavin mononucleotide, hematoporphyrin, hemin, malachite green, methylene blue, rhodamine B, chlorophyll, cosine, erthrosin, methylene green, toluidine blue, thionine, and the like;

(g) azide-containing compounds such as azidobenzene, p-phenylene bisazide, p-azidobenzophenone, 4,4'-diazido-benzophenone, 4,4'-diazidodiphenylmethane, 4,4'-diazido-stilbene, 4,4'-diazidochalcone, 3,6-di(4'-azidobenzal)cyclo-hexanone, 2,6-di(4'-azidopbenzal)-4-methylcyclohexanone, and the like;

(h) diazonium salt radicals such as p-diazodipheny-lamineparaformaldehyde condensates, 1diazo-4-dimethy-laminobenzene hydro-fluoroborate, 1-diazo-3-methyl-4-dimethylaniline sulfate and the like; and (i) multifunctional compounds containing the above photosensitive groups such as 1,2-naphthoquinonediazide, 2,3, 4-trihydroxybenzophenone, bis-(naphthoquinone-1,2-di-azido-5-sulfonate), 2-(naphthoquinone-1,2-diazido-5-sulfonyuloxy)- 3-hydroxynaphthalene, naphthoquinone-1,2-diazido-5-sulfonic acid novolak ester, naphthoquinone-1,2-diazido-5-sulfanilide, azidobenzoic acid, azidophthalic acid, and the like; and (j) metal chelate compounds such as benzene chromium tricarbonyl and the like.

A comprehensive discussion of photoinitiators is found in the Rabek publication mentioned earlier. These compounds generally either contain suitable reactive moieties for functionalization of the halogenated isoolefin/para-alkylstyrene base terpolymers via nucleophilic substitution, or can be readily modified to incorporate suitable reactive moieties such as hydroxy or carboxyl radicals or carboxylate salts or esters.

In a further embodiment of this invention a third functional group may be grafted onto the para-alkyl groups on the styrene. A plurality of additional side chain species (e.g. non-para-alkylstyrene-based side chains) may be grafted to the main chain wherein the grafted side comprise an oligomer or macromonomer ($M_w$>1000). The oligomer ad/or macromonomer has in its structure suitable functionality which can be used in a grafting reaction with the main chain polymer also suitably functionalized. Where the grafted side chains comprise macromonomers, the functional group is preferably a terminal functional group. Examples of grafting reactions include transesterification, nucleophilic substitution, condensation, and the like. For example, in a polymer also comprising pendant carboxylic acid functionality such as an ethylene-propylene-acrylic acid-poly (para-alkylstyrene) polymer, carboxylic acid groups may undergo a transesterification reaction with a molecule having terminal hydroxy functionality (e.g. 1-butanol) to incorporate the molecular kernel as a pendant ester side chain. Alternately, a nucleophilic substitution reaction may be utilized to graft the pendant side chains. Appropriate electrophilic leaving groups such as halogens may be copolymerized into the main chain as a halide containing comonomer (e.g. vinyl chloride), or the polymer main chain may be functionalized in a post-polymerization reaction, (e.g. selective halogenation). The halide functionality containing main chain polymer can be reacted with a nucleophilic terminated macromolecule (e.g. produced by anionic polymerization) in a nucleophilic substitution reaction.

Representative examples of other polymer configuration embodiments include block architecture, e.g. polyolefin elastomer blocks alternating with poly(para-alkylstyrene) blocks; polyolefin elastomer backbone having attached thereto by any representative grafting reaction one or more poly(para-alkylstyrene) side chains in random or non-random placement; a thermoplastic poly (para-alkylstyrene) backbone having attached thereto one or more elastomeric polyolefin side chains in random or non-random placement; and the like.

Adhesive, coating or sealing performance depends on the content and type of the acrylate and/or photoinitiator functionalized copolymer or copolymer blend, as well as the crosslink density. Crosslink density is a direct function of radiation exposure and the type and concentration of acrylate and radiation-sensitive functionality. Important variables in determining the type of functionality include the desired degree of functionalization for actinic radiation exposure, and wavelength of energy absorbance. Also, the photopolymer or EB curable polymer must generally exhibit good crosslinking response when irradiated in the presence of any additional components contained in the coating composition including any additives and/or extenders.

A rather surprising aspect of the present invention is the discovery that acrylate-functionalized isobutylene/para-methylstyrene copolymers readily undergo crosslinking and gel formation with low amounts of exposure to UV radiation or EB bombardment, even in the absence of a photoinitiator. Typically, acrylate crosslinking via the reaction of the carbon-carbon double bond requires a source of free-radical, generally supplied in the form of a photosensitive free-radical initiating compound. Therefore, it is unexpected that the acrylate-functionatized copolymers of this invention would be radiation, particularly UV or actinic radiation, curable without using any photoinitiator.

The photoinitiator surprisingly enhances the adhesion properties of the crosslinked acrylate-functionalized copolymer. The adhesive properties, including peel strength, shear strength and crosslink network density are synergistically improved when the photoinitiator is used, in addition to the acrylate functionality, either grafted onto the copolymer or blended therewith, or grafted onto a second copolymer blended with the acrylate-functionalized copolymer. There is a synergistic improvement in that the adhesive properties and gelation are better when the photoinitiator and acrylate functionalities are used in combination than when either of the photoinitiator and/or acrylate functionalities are used as the sole crosslinking agent in an equivalent amount. The benzophenone photoinitiator, for example, serves to sensitize the acrylates for UV crosslinking, and also enhances EB initiated crosslinking.

In addition, the presence of the photoinitiator moiety thermally stabilizes the acrylate-functionalized isobutylene/ para-methylstyrene copolymer. It has been discovered that the acrylate-functionalized copolymer tends to gel or crosslink when subjected to elevated temperatures, as expected, but the thermally induced crosslinking or gel formation is substantially inhibited when the photoinitiator moiety, e.g. benzophenone, is present in relatively minor proportions. Thus, when the acrylate-functionalized copolymer is to be subjected to elevated temperatures, such as, for example, in hot-melt adhesive applications, the use of an additional thermal stabilizer such as a hindered phenol (e.g. BHT, IRGANOX 1010 and the like) can be eliminated. By grafting the photoinitiator moiety directly onto the isobutylene/para-methylstyrene copolymer, the presence of low molecular weight compounds which might volatilize or leach out of the copolymer composition can be avoided.

Coating performance, e.g., adhesion to various substrates, is also dependent upon composition of the polymer backbone, including the molecular weight, architecture and concentration of para-methylstyrene, i.e., the degree to which the radiation-reactive polymer is elastomeric-like (high in isobutylene, low $T_g$) versus the degree to which it is thermoplastic-like (higher in para-methylstyrene, high $T_g$). Increasing para-methylstyrene concentration in the polymer backbone generally contributes to an overall increase in $T_g$, and consequently, is a variable for optimization. Likewise related is optimization of molecular architecture, i.e. branched versus linear molecules. Incorporation of other functionality into radiation curable coating systems opens new variables for even greater control of polymeric architecture and property optimization for a variety of different substrates.

The paths taken by radiation-reactive crosslinking depend on the type of photoinitiator or other functionality incorporated in addition to the acrylate. For example, the cinnamate derivative copolymer, e.g. cinnamoyl (CH=CH—C(O)—), undergoes 2+2 photocycloaddition upon UV initiation:

moiety in Chain A

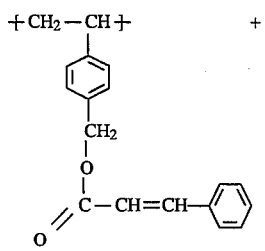

moiety in Chain B

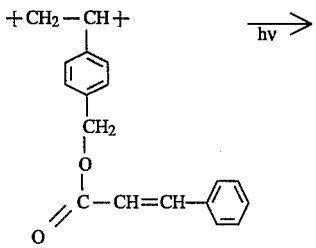

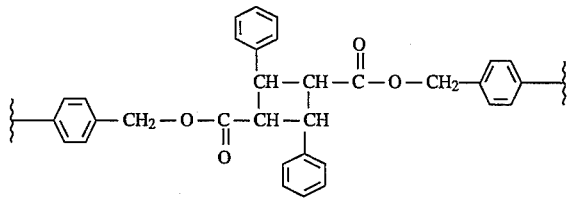

On the other hand, the hydroxybenzophenone derivative undergoes free radical crosslinking under UV exposure. The incorporated benzophenone moiety is a well known photoinitiator in that it reacts with UV radiation to produce a free radical in the enchained benzophenone functionality via a hydrogen abstraction mechanism.

The presence of other functionality is optional and may be either interdispersed on a single functionalized base copolymer with multiple functional groups (of which at least one is radiation-reactive), or two or more functionalized copolymers may be blended together. The presence of the additional functionality enables other desirable properties to be incorporated into an adhesive or coating system. For example, the presence of amine functionality in addition to radiation-curable functionality can facilitate emulsification application of radiation-curable lithographic coatings. Also, the amine derivatives can be used in combination with the benzophenone photoinitiation to provide easily abstracted protons.

As another example of mixed functionality, certain radiation-reactive functional groups act as energy amplifiers and transfer agents for other radiation-reactive groups, thereby allowing for enhanced sensitivity of selected adhesives and coatings with lower energy absorbance in a wider frequency range. Photoexcitable acroleinium salt functionality present in a coating composition can act as an energy amplification and transfer agent for cinnamate groups which otherwise have a high UV absorbance, low UV transmissivity, and a narrow UV frequency photoinitiation range. The addition of the photoexcitable functionality can allow for greater curing depth and/or thicker coatings in a cinnamate-based system, if selectively excited at a wavelength which differs from the absorption peaks of the cinnamate functionality.

The radiation-reactive copolymer includes at least one acrylate functionality, and preferably at least one photosensitive functionality, so the copolymer and adhesives and coatings formulated with it are curable by actinic or electromagnetic radiation. By incorporating the acrylate and/or photoinitiator directly onto the pendant para-methylstyrene groups randomly dispersed in the polyisobutylene backbone, the polymer can be cured directly by actinic or electromagnetic radiation. Furthermore, radiation-curable systems containing a single derivatized copolymer or a blend of several copolymers with at least one acrylate functionality, radiation-curable functionality and/or other functional groups can be tailored to enhance adhesion to specific substrates, both polar and non-polar categories. For example, the presence of carboxylic acid functionality can enhance aluminum adhesion whereas silane functionality enhances adhesion to glass. In addition, silane functionality may be useful in semiconductor manufacturing processes requiring organosilicon polymer photoresist coatings, i.e. multilayer lithography.

It is understood that the above illustrative examples should not be considered limiting as one having ordinary skill in the art can determine embodiments of systems for lithographic or corrosion barrier coatings with useful multiple functional groups incorporated therein other than the ones described above.

B. Tackifiers and Other Resin Components

An optional component of the adhesive, lithographic or corrosion resistant coating compositions of the present invention is a tackifier suitable for use with UV- or EB-reactive copolymers. Suitable tackifiers include those resins which are compatible with the copolymer or copolymer blend. Tackifiers are chosen to impart substantial adhesive strength, promote substrate wetting and generally enhance coating performance, e.g., optimize tack performance versus temperature performance of the cured composition where applicable. The tackifier must generally not substantially interfere with the photosensitivity of the UV- or EB-reactive polymer(s) and the ability for gel conversion.

Tackifier components suitable for use in this invention include aliphatic and aromatic hydrocarbon resins such as ESCOREZ or WINGTACK 95. WINGTACK 95 is the tradename for a diene-olefin copolymer of piperylene and 2-methyl-2-butene having a softening point of 95° C. The resin is prepared by the cationic polymerization of 60 weight percent piperylene, 10 weight percent isoprene, 5 weight percent cyclopentadiene, 15 weight percent 2-methylbutene and about 10 weight percent dimer. See U.S. Pat. No. 3,577,398. Other tackifying resins of the same general type may be employed in which the resinous copolymer comprises 20-80 weight percent of piperylene and 80-20 weight percent of 2-methyl-2-butene. Other adhesion-promoting resins which are also useful in the compositions of this invention include hydrogenated rosins, rosin esters, polyterpenes, terpenephenol resins, and polymerized mixed olefins. Hydrogenated hydrocarbon resins obtained under the trade designation ESCOREZ 5380 and ECR-143H are preferred because unsaturation present in the tackifier may reduce the conversion of polymer to gel through radiation energy absorption or through tackifier participation in crosslinking when the coating is cured. These tackifiers typically have a ring and ball softening point from about 10° C. to about 180° C., preferably from about 15° C. to about 75° C. Other hydrocarbon tackifiers obtained from Exxon Chemical Co. under the trade designations ECR-111, and ECR-327 have also been found to be particularly preferred. ECR-143H resin, for example, is prepared by the cationic polymerization of a $C_5$ olefin/diolefin feed stream as described in U.S. Pat. No. 4,916,192 which is hereby incorporated by reference herein. The relative inertness of ECR-327 and ECR-143H tackifiers to radiation, as indicated by their substantially unchanged molecular weight when exposed to as much as 5 Mrad EB radiation (see FIG. F), makes them particularly preferred.

PSA properties are dependent on selection of tackifier resin. Particularly important are the $T_g$ and the miscibility of the tackifier. Optimization studies show that tack-related properties which are nominally inversely proportional to crosslink density can be improved by optimizing the $T_g$ of the PSA system. Selection of tackifier is an important variable in this regard. For example, when ECR-143H and ECR-111 tackifiers were blended together in equal proportions, several tack properties improved in PSA systems incorporating the blended tackifier over PSA systems incorporating each individual tackifier resin. General tackifier composition is also a strong variable in PSA property optimization.

An additional optional component of the coating composition of the present invention is a radiation inactive polymer wherein such addition does not interfere with the necessary radiation sensitivity. Radiation inactive resins may act as low cost extenders or introduce other desired functionality.

C. Preparation and Utility of the Coating Composition

PSA systems which are an embodiment of this invention may contain a tackifier resin in an amount of from about 5 to about 95 parts by weight and the functionalized polymer or polymers having at least one acrylate-functional group in an amount of from about 5 to about 95 parts by weight, relative to the tackifier parts by weight. Preferred PSA systems contain the tackifier in an amount of from about 30 to about 70 parts by weight, and functionalized polymer or polymers having at least one acrylate/radiation-reactive functional group in an amount of from about 30 to about 70 parts by weight.

The adhesive composition may further contain relatively minor amounts of ingredients such as, oils, fillers, coupling agents, colorants, antioxidants, and other stabilizing additives which do not substantially adversely affect the system such as, for example, by adversely interfering with crosslinking or adhesion to a substrate surface. The formulation is preferably a hot melt essentially free of solvents and other vaporizable constituents which detract from the hot melt characteristics of the formulation, e.g., no need for drying or solvent removal.

Coating systems which are an embodiment of this invention may optionally contain a non-radiationreactive resin including both tackifiers and high polymers blended up to about 50 parts by weight and the functionalized polymer having at least one acrylate functional group in an amount of 50 parts by weight or more wherein the parts by weight of the radiation- and non-radiation-reactive components total 100.

A significant feature of the present invention is the elimination of the need for stabilizers when mixed acrylate and radiation reactive functionalities are grafted to the methylstyrene of the isobutylene/para-methylstyrene copolymer. Thus, the mixed functionality formulation is preferably essentially free of low molecular weight, ungrafted additives, and can be maintained under inert atmosphere, e.g., nitrogen, argon or the like, for further stability. However, the antioxidant or stabilizer, when used, can be added at from about 0.1 to about 3 percent by weight, preferably from about 0.1 to about 1.5 percent by weight, more preferably from about 0.1 to about 1 percent by weight, and typically at about 0.5 weight percent.

The optional oils which may be mentioned include refined hydrocarbon oils typically present in adhesives, including paraffinic, aromatic, and naphthenic oils available under the trade designations KAYDOL (produced by WITCO), TUF-FLO (produced by ARCO), and the like. The refined oils serve to reduce viscosity and improve surface tack properties.

Particulated fillers which may be also used for thickening and price reduction include glass, silica, amorphous $SiO_2$, fumed alumina, calcium carbonate, fibers and the like. Suitable commercially available fillers are available under the trade designations CAB-O-SIL, ZEOSIL 35, AEROSIL R972, DUCRAL 10 and the like.

Suitable coupling agents include (but are not limited to) organometallic compounds such as, for example, silane-based compounds, organotitanates, organozirconates, organozircoaluminates, chrome complexes and the like. These are generally selected to promote adhesion based on the substrates and/or fillers involved in the particular application.

Suitable dyes include Fuchsine (CI 42510), Calcocid Green S (CI 44090), solvent Yellow 34 (CI 4100B), and the like. Suitable pigments include titanium dioxide, colloidal carbon, graphite, ceramics, clays, phosphor particles and metal particles, e.g. aluminum magnetic iron, copper, and the like.

The coating compositions of this invention are preferably prepared as organic solvent solutions of the radiation-reactive copolymer and any other components, although copolymer emulsions and hot melts may also be used if so desired. The coating compositions may be applied to the substrate from a solution of up to about 40 percent weight solids of the ingredients in a solvent such as toluene, the solvent being removed by evaporation prior to crosslinking by exposure to the radiation. Alternatively, the ingredients may be mixed in a solvent, the mixture may be emulsified and the solvent evaporated, and the coating may be applied to a substrate as 50–60 percent weight solids emulsion, the water being removed by evaporation with conventional drying equipment and techniques prior to crosslinking.

For hot melt application, the coating compositions may be prepared by blending the radiation-reactive polymer with any optional component in the melt until a homogeneous blend is obtained. Various methods of blending materials of this type are known to the art, and any method that produces a homogeneous blend is satisfactory. Typical blending equipment includes, for example, mixing extruders, roll mills, Banbury mixers, Brabenders and the like. In general, the blend components blend easily in the melt and a heated vessel equipped with a stirrer is all that is required. The components are added in no particular order, but generally the polymer resin is added first and heated in the vessel until molten. Thereafter, any optional components are then added.

The hot melt formulation may be cooled and later reheated for use, or used directly, e.g. supplied from a reservoir or melt pot to a substrate using conventional equipment, for example, for pumping or pressure extrusion through slot dies. An important feature of the present invention is that the hot melt formulation based on acrylate functionalized and/or photoinitiator functionalized isobutylene/para-methylstyrene copolymers has improved melt pot stability so that appreciable premature curing of the formulation is not usually encountered at typical hot melt conditions, such as, for example, from about 60° C. to about 140° C. Generally, the hot melt is heated sufficiently for a target viscosity of about 100,000 cps, although a viscosity as high as 150,000 cps can usually be tolerated. For suitable pot stability, the viscosity of the hot melt should not increase more than 20 percent when maintained at the pot temperature for a period of 8 hours.

The preparation of coated articles such as films, sheets, plates and molded objects involves the initial step of coating at least a portion of a surface of the selected article with a solution, emulsion or hot melt of the radiation-reactive composition. Any suitable coating technique may be employed while applicable substrates, including composites thereof, may be comprised of paper and paperboard; fiberglass; wood; graphite; conductive metals, e.g. copper, aluminum, zinc, and steel, etc.; and semi-conductive substrates such as silicon and gallium arsenide; glass and ceramic; textiles, both natural and synthetic, woven and non-woven; synthetic resins including the homo- and copolymers of ethylene, propylene, vinyl chloride, vinylidene chlqride, vinyl acetate, styrenes, isobutylene, and acrylonitrile; poly(vinyl acetal); poly(ethylene terephthalate); polyamides; and cellulose esters such as cellulose acetate and cellulose butyrate. The latter polymeric substrates may contain fillers or reinforcing agents, such as the various synthetic, natural or modified fibers, including, for example, cellulosic fiber, e.g. cotton, cellulose acetate, viscose rayon, and paper; glass; and polyamide fibers. These reinforced substrates may be used in laminated or composite form.

The coating of the radiation-reactive copolymer composition should be applied to the substrate surface so that upon drying its thickness will be in the range of about 0.05 to about 10 mils, 1.5 mils is preferred (0.00254 cm=1 mil). Drying of the wet polymer coating may be achieved by air drying or by the application of any other particular drying technique is favored by the practitioner. The substrate comprising the radiation-reactive coating may be stored for prolonged periods before its ultimate utilization.

Suitable sources of actinic radiation employed to effect the crosslinking reaction include carbon arc, mercury-vapor are and fluorescent sun lamps. The electron beam radiation or high energy ionizing radiation can be obtained from any suitable source such as an atomic pile, a resonant transformer accelerator, a Van de Graaf electron accelerator, a Linac electron accelerator, an electrocurtain 2, a betatron, a synchrotron, a cyclotron, or the like. Radiation from these sources will produce ionizing radiation such as electrons, protons, neutrons, deuterons, gamma rays, X-rays, a-particles and b-particles.

The crosslinking reaction is conveniently effected at room temperature, but it can be conducted at depressed or elevated temperatures if desired. It is also within the spirit and scope of the invention to effect the crosslinking reaction within the confines of an inert atmosphere to prevent air inhibition of the crosslinking reaction and to prevent oxidative degradation of the polymer. The amount and kind of radiation required depends primarily on the type and amount of acrylate and/or radiation-sensitive functionality employed, thickness of the coating and the level of curing desired. Suitable doses of EB radiation include from about 1 kGy (0.1 megarad) to about 100 kGy (10 megarad), preferably from about 1 kGy (0.1 megarad) to about 50 kGy (5 megarad), grferably less than 30 kGy (3 Megarad). Suitable doses of UV radiation include from about 0.01 to about 2 $J/cm^2$, preferably from about 0.05 to about 0.50 $J/cm^2$, even more preferably less than about 0.25 $J/cm^2$.

A preferred use of the present invention is in the preparation of pressure-sensitive adhesive tapes or in the manufacture of labels. The pressure-sensitive adhesive tape comprises a flexible backing sheet and a layer of the adhesive composition of the novel PSA compound coated on one major surface of the backing sheet. The backing sheet may be a plastic film, paper or any other suitable material and the tape may include various other layers or coatings, such as primers, release coatings and the like, which are used in the manufacture of pressure-sensitive tapes.

The advantages of PSA formulations crosslinked through UV or EB exposure are improved cohesive strength, shear adhesion failure temperatures, and resistance to abrasion and solvents. Sealants or caulks acquire improved weatherability and temperature resistance.

An advantage of PSA materials comprising a polyisobutylene polymer incorporating phenyl rings is a polymer backbone free of unsaturations. These unsaturations are typically highly reactive sites for ozone degradation which generally occurs in elastomers comprising isoprene. Usaturated sites are also liable to be weak points during any free-radical crosslinking cure process. In addition, the presence of the phenyl rings enhances the UV and EB resistance to degradation of the polyisobutylene backbone. General aging and weathering properties are improved as compared to other radiation crosslinked elastomers, such as natural rubber or Kraton 1320X.

An advantage of UV reactive PSA systems which are an embodiment of the present invention arises from internalization of the photoinitiating reagent for a photocycloaddition or a free radical crosslinking mechanism into the polymer molecule. This innovation can eliminate additaments such as photoinitiators and crosslinking promoters which are otherwise necessary to cure PSA systems by free-radical mechanisms, particularly PSA systems crosslinked with acrylic monomers or functionality. Volatility and toxicity of added photoinitiators and promoters are common problems generally associated with radiation processing.

The crosslinkable compositions can also be used for a wide variety of applications including lithographic, corrosion resistant, barrier and other applications where high oil, grease and solvent resistance as well as increased stiffness resulting from a crosslinked matrix are required. Specifically, they may be used in photo-reproduction processes such as in photography, photomechanical reproductions, lithography and intaglio printing; in processes requiring photo-etch-resist masks wherein it is desirable to engrave or etch intricate shapes and/or designs such as microcircuit designs without the use of cutting tools; as corrosion barrier films on metals; as water, oil and/or solvent-proofing of coated articles including, paper, cardboard, textiles, plastics, elastics; shatterproofing coatings on glass; caulks and sealants; and the like.

Lithography generally refers to processes for pattern transfer between various media. A lithographic coating is generally a radiation-sensitized coating suitable for recefving a projected image of the subject pattern. Once projected, the image is indelibly formed in the coating. The projected image may either be a negative or positive of the subject pattern. Typically, a "transparency" of the pattern is made having areas which are selectively transparent or opaque to the "projecting" radiation. Exposure of the coating through the transparency causes the image area to become selectively crosslinked and consequently either more or less soluble (depending on the coating) in a particular solvent developer. The more soluble, i.e. uncrosslinked, areas are removed in the developing process to leave the pattern image in the coating as less soluble crosslinked polymer.

Suitable developing solvents include perchloroethylene, methylene chloride, ethylene dichloride, methylethylketone, n-propanol, toluene, benzene, ethyl acetate and water, where applicable. The solvent liquid used for this operation must be selected with care since it should have good solvent action on the unexposed areas, yet have little action upon either the insolubilized copolymer or the substrate. The developing solvent should be allowed to remain in contact with the coating for a period of from about 30 seconds to 10 minutes depending upon the particular solvent being utilized. The thus developed polymer coating should next be rinsed with fresh solvent and thereupon dried.

The developing process, particularly in printing applications, may also comprise several different steps including etching of an underlying substrate to enhance the height of the relief image area, removing the uncrosslinked coating and altering the hydrophilic properties of the substrate.

The present invention has utility in photo-reproduction processes where the crosslinked coating remains as raised printing elements generally on a plate. Ink may be carried by the raised portion of the plate as in dry-offset printing and ordinary letterpress printing, or may be carried by the recessed portions of the plate such as in intaglio printing, e.g. line and inverted halftone. Thickness of the radiation-reactive layer is a direct function of the thickness desired in the relief image and this will depend on the subject being reproduced and particularly on the extent of the non-printing areas. Further examples of such uses are offset printing, silk screen printing, duplicating pads, manifold stencil sheeting coatings, lithographic plates, relief plates, gravure plates, photoengraving, collotype and planographic type elements, magenta screens, screen stencils, dyeable images of the halftone and continuous type, in direct positive and negative systems utilizing wet development which incorporate color formers and coupling agents in vapor developed systems which incorporate diazonium salts and coupling agents.

These lithographic coating compositions are also useful as resist layers (i.e. photoresists) in carrying out chemical and other type etching or engraving operations. Following pattern transfer and removal of the uncrosslinked coating, the crosslinked coating comprises a mask for the etching step. Applications include the preparation of ornamental plaques or for producing ornamental effects; as patterns for automatic engraving machines, foundry molds, cutting and stamping dies, name stamps, relief maps for braille, as rapid cure coatings, e.g. on film base; as television phosphor photobinders, as variable area sound tracks on film; for embossing plates, paper, e.g. with a die prepared from the radiation-sensitive coating; particularly as photoresists in the manufacture of printed circuits, other plastic articles and microchips.

The radiation-curable coating compositions of the present invention can readily be shaped into films, sheets, and other molded articles and then exposed to active radiation, such as visible, ultraviolet, or high energy radiation, to crosslink the polymers and thereby render them infusible and insoluble for use as corrosion resistant, solvent resistant and other barrier coatings.

The present coating composition may be used as a corrosion resistant barrier coating on various metal surfaces in intimate contact with corrosion-causing fluids or gases including water, seawater, high and low pH fluids, and the like or exposed to a corrosion-causing environment. Examples include, liners in food and beverage containers; liners in or on the exterior of vessels, pipes, and miscellaneous equipment used in manufacturing plants, ships, and the like; and antirust coatings for automobiles, etc.

As other useful coatings, the uncrosslinked copolymers may be used as film-forming binders or adhesives in the production of various coating and/or impregnating compositions for application to papers and textiles which after irradiation can be rendered resistant to removal by heating or solvents. The copolymers can be used as binders for non-woven fabrics or webs. They may be applied uniformly over the entire area of the non-woven web or in any predetermined pattern, e.g. along intersecting sets of parallel lines, either straight or curved in a regular or even somewhat irregular array. The impregnated non-woven web may then be subjected to actinic radiation, for example, to crosslink the polymer wherever it is present, thereby rendering the treated non-woven web more or less resistant to disintegration by water or solvents.

As a web coating the present invention may be applied uniformly throughout the area of the web and then the web may be crosslinked in a predetermined pattern through a light filter or opaque screen so that only selected areas of the polymer film coating are affected. After the screened exposure, the unexposed portions of the coating may be removed.

In such methods, the coatings of the present invention may be used to produce "wet wipes", disposable diapers and/or diaper covercloths. The use of a screen or filter can control the extent of crosslinking selectively in various areas of the bonded diaper or diaper covercloth so that, for example, the crotch areas can be rendered resistant to disintegration by water-soaking whereas the peripheral areas can be disintegrated within a short time of half a minute to two minutes or so on soaking in water.

In addition, the coating compositions of the present invention may be applied as sealants and caulks at low viscosity and cured by exposure to UV or EB radiation and as protective shatter-proofing coatings for glass and other articles comprising brittle materials.

C-1. Preparation and Use of Other Compositions Containing Acrylate Functionalized Copolymer The acrylate and optional photosensitive group grafted polymer of this invention can also be blended into other compositions as a radiation reactive crosslinking agent. For example the acyrlate grafted copolymer with or with out the photosensitive functionality can be blended with one or more elastomers in an amount up to about 30 phr graft copolymer, preferably up to about 15 phr. The elastomer composition can further contain up to 100 phr carbon black, preferably up to 60 phr. These composition can be further blended with other fillers and additives known it the elastomer art. The compositions can then be further exposed to radiation to cure the elastomeric composition. These elastomeric compositions can be formed into articles, films, laminates, coatings, tire treads belts, hoses, air dams, molded car parts, trim, and the like. The elastomers that can be blended with the copolymer of this invention include but are not limited to: natural rubber, ethylene propylene rubber, ethylene propylene diene terpolymer, neoprene rubber nitrile rubber, butadiene rubber, Butyl rubber, chlorobutyl rubber, bromobutyl rubber, polyisobutylene rubber, isoprene rubber, acrylonitrile butadiene rubber, acrylonitrile chloroprene rubber, acrylonitrile isoprene rubber, styrene butadiene rubber, vinyl pyridene styrene butadiene rubber, styrene butadiene styrene block copolymer, styrene chloroprene rubber and styrene isoprene rubber.

Likewise the acrylate grafted copolymers of this invention can also be included in blends of elastomers and "plastic" polymers to form thermoplastic elastomers. The plastic polymer that can be blended with any of the elastomer listed above include but are not limited to homo- and co-polymers of ethylene, propylene, butene, and styrene, where any comonomer if present is an olefin present at up to about 10 weight percent, preferably up to about 5 weight percent, based upon the weight of the copolymer. The term copolymer as used herein is hereby defined to include any polymer of two or more different monomers as well as block copolymers. Ter- and tetra- polymers are specifically included in this definition. Specific of "plastic" polymers include thermoplastic and thermosetting polymers such as high density polyethylene, polypropylene, random copolymers of propylene (with up to 5 weight percent ethylene or other alpha olefin monomer), polystyrene, and the like. In these compositions the grafted copolymer can be present at up to about 30 phr, preferably up to about 15 phr, and the "plastic" polymer can be present at up to about 50 weight percent, preferably up to about 30 weight percent, even more preferably up to about weight percent, based upon the wieght of the copolymer. These compositions then can also be molded into articles, films, fibers, coatings, laminates, bumpers, interior car trim exterior car trim, and the like. Before or after the molding, these compositions can be exposed to radiation to crosslink the composition.

D. Preparation of the Acrylate Functionalized Copolymer

1. Copolymer Precursor Preparation

This invention is, in part, based upon the discovery that the polymerization of isoolefin and para-alkylstyrene under certain specific polymerization conditions now permits one to produce radiation-reactive functionalized (via halogenation and nucleophilic substitution) precursor copolymers which comprise the direct reaction product (that is, in their as-polymerized form), and which have unexpectedly homogeneous uniform compositional distributions. Thus, by utilizing the polymerization procedures set forth herein, the polymeric backbones, or precursor copolymers of the novel functionalized copolymers employed in the coating compositions of the present invention can be produced. These copolymers, including the radiation-reactive copolymers, as evaluated by gel permeation chromatography (GPC), demonstrate narrow molecular weight distributions and substantially homogeneous compositional distributions, or compositional uniformity over the entire range of compositions thereof. Put another way, at least about 95 percent by weight of the precursor copolymer product has a para-alkylstyrene content within about 10 percent by weight, and preferably within about 7 percent by weight, of the average para-alkylstyrene content for the overall composition, and preferably at least about 97 percent by weight of the copolymer product has a para-alkylstyrene content within about 10 percent by weight, and preferably within about 7 percent by weight, of the average para-alkylstyrene content for the overall composition. In a most preferred embodiment hereof, this is demonstrated by the fact that the normalized differential refractive index (DRI) and ultraviolet (UV) curves obtained by GPC for these functionalized copolymers are essentially superimposable on each other and substantially merge into a single curve in most instances. This substantially homogeneous compositional uniformity thus particularly relates to the intercompositional distribution. That is, with the precursor copolymers of this invention, as between any selected molecular weight fraction the percentage of para-alkylstyrene therein, or the ratio of para-alkylstyrene to isoolefin, will be substantially the same, in the manner set forth above. Since the relative reactivity of para-alkylstyrene with isoolefin such as isobutylene is close to 1.0, the intracompositional distribution of these copolymers will also be substantially homogeneous. That is, these precursor copolymers are essentially random copolymers, and in any particular polymer chain the Para-alkylstyrene and isoolefin units will be essentially randomly distributed throughout that chain.

The properties of these precursor copolymers leads to a number of distinct advantages over the prior art, including the ability to produce useful functionalized copolymers having number average molecular weights generally greater than about 5000. The precursor copolymers useful for radiation-reactive functionalization in the coatings, methods and articles of the present invention include compositionally homogeneous copolymers having number average molecular weight ($M_n$) from about 5000 to about 500,000, preferably from about 50,000 to about 300,000, more preferably from about 50,000 to about 150,000. These products also exhibit a relatively narrow molecular weight distribution. In particular, these functionalized copolymers thus exhibit $M_w/M_n$ values of less than about 6, preferably less than about 4, more preferably less than about 2.5 and at the same time, depending upon the ultimate intended use thereof.

Thus, distributed throughout the precursor copolymer are the para-methylstyrene units:

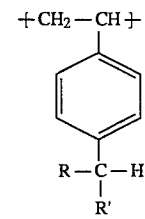

in which R and R' are, independently, selected from the group consisting of hydrogen, alkyl, preferably $C_1$ to $C_5$ alkyl, and primary and secondary alkyl halides, preferably primary and secondary $C_1$ to $C_5$ alkyl halides.

With respect to the ratio of the monomers employed to produce the precursor copolymers for nucleophilic functionalization into radiation crosslinkable copolymers, it is a distinct advantage of the present invention that a very wide range of the ratio of the monomers in the precursor copolymer product can be utilized in accordance with this invention. It is therefore possible, for example, to produce precursor copolymer products which operably comprise from about 10 to about 99.5 percent by weight, preferably between about 80 and 99 percent by weight, and most preferably from about 90 to about 98 percent by weight of the of the isoolefin or isobutylene and from about 0.5 to about 90 percent by weight, preferably from about 1 to about 20 percent by weight, more preferably from about 2 to about 10 percent by weight of the paraalkylstyrene, preferably para-methylstyrene. On the other hand, it is also possible to produce thermoplastic materials comprising higher concentrations of para-alkylstyrene, and therefore the copolymers comprise from about 10 to about 99.5 percent by weight of the-isoolefin, preferably isobutylene, and from about 0.5 to about 90 percent by weight, preferably from about 1 to about 90 percent by weight of the para-alkylstyrene, or preferably paramethylstyrene.

2. Halogenated Base Terpolymer Preparation

The Isoolefin/para-alkylstyrene polymer of this invention is then halogenated to permit functionalization by substitution of other functional groups at that site. The polymer can be halogenated by the process disclosed in copending U.S. Ser. No. 547,480, filed Jul. 2, 1990, which is incorporated by reference herein. The halogenated polymer can also be purchased from EXXON CHEMICAL COMPANY under the tradename BROMO XP-50.

3. Nucleophilic Substitution of the Base Terpolymer

The benzylic bromine (halogen) functionality is uniquely suited, as the base from which the versatile acrylate-functionalized copolymers of this invention can be prepared, because it can be made to undergo selective nucleophilic substitution reactions with a great range of nucleophiles, so that almost any desired type and amount of functionality can be introduced without undesirable side reactions and under conditions which are mild enough to avoid degradation and/or crosslinking of the saturated copolymer backbone containing the pendant benzylic halogen functionality. Furthermore, in many instances, it is possible to only partially convert the pendant benzylic halogen to the desired acrylate-functionality while retaining some, or to simultaneously or sequentially convert another portion, of the remaining benzylic halogen functionality to a photosensitive functionality, or to yet another new functionality, so that copolymers containing mixed acrylate and photosensitive functionalities can be made. The mixed functionality can advantageously provide unique combinations of properties, such as thermal stability, crosslinkability and shear strength and peel adhesion.

One of the attributes of the benzylic halogen functionality of the radically halogenated isobutylene/para-methylstyrene copolymers which makes them an ideal base copolymer from which to prepare the acrylate/photosensitive functionalized copolymers is the wide range of nucleophilic substitution reactions this benzylic halogen functionality will undergo and the relatively mild conditions under which these nucleophilic substitution reactions will proceed. A benzylic halogen functionality constitutes a very active electrophile which will react under suitable conditions with any nucleophile capable of donating electrons to it. Suitable nucleophiles include those containing oxygen, sulfur, nitrogen, phosphorus, carbon, silicon, and various metals including especially magnesium, lithium, sodium, and potassium. Suitable acrylate nucleophiles include, for example, carboxylate esters and salts such as tetraalkylammonium acrylates, and the like. Equally important to this versatility in types of nucleophiles which will react with the benzylic halogen functionality is the relatively mild conditions under which these nucleophilic substitution reactions proceed so that substitution reactions can be completed to introduce the desired new functionality without cleavage or crosslinking reactions involving the saturated hydrocarbon backbone of the isobutylene/paramethylstyrene copolymer.

Another of the attributes of the benzylic halogen functionality is the selectivity with which the desired substitution reactions can be made to proceed without undesirable side reactions. The benzylic halogen functionality will undergo clean substitution reactions without complicating elimination reactions. This attribute is extremely important in reactions involving soluble high polymers, since even a tiny amount of a side reaction which can lead to coupling may lead to gelation. In reactions involving simple molecules (which are usually mono-functional) yields of only 70 percent of the desired product may be acceptable, since purification and separation of the undesired products is relatively simple. In reactions involving already cross-linked polymers (e.g. "Styragels") lower yields to the desired product may also be acceptable, since the starting polymer is already insoluble. However, in reactions with the soluble high polymers of this invention which contain many functional groups per molecule, it is necessary to achieve >99 percent of the desired substitution reaction in order to maintain solubility during reaction and recovery. Tiny, almost insignificant (in other reactions) amounts of side reactions which produce gel may interfere with usefulness. Furthermore, purification of the substituted polymer to remove unwanted side products is usually very difficult or impossible. This is why the selective single route to high yield nucleophilic substitution reactions achievable with benzylic halogen functionality under controlled conditions is important. By using isobutylene/para-methylstyrene/parabromomethylstyrene terpolymers as a "base" polymer for modification, and by conducting nucleophilic substitution reactions under appropriate and controlled conditions, soluble, backbone-saturated copolymers containing useful pendant functionality have been prepared. Examples include:

(1) Esters (many containing other function groups such as acetate, stearate linoleate, eleostearate, cinnamate, etc.);

(2) Hydroxyl (attached directly in place of the benzylic bromine or attached via another linkage);

(3) Carboxy;

(4) Nitrile;

(5) Quaternary ammonium salts;

(6) Quaternary phosphonium salts;

(7) S-Isothiuronium salts;

(8) Dithiocarboxylate esters;

(9) Mercaptans;

(10) Carboxylate esters and phenolates which contain radiation-reactive functional groups exemplified by benzoylbenzoate, cinnamate, tung oil fatty acid esters, and anthraquinone-2-carboxylate;

(11) UV-reactive dithiocarbamate esters;

(12) Nucleophilically terminated macromonomers exemplified by polystyryllithium, polystyryl carboxylate, etc.

While every reactive derivative, in general, and radiation-reactive derivative specifically, that could be prepared by nucleophilic substitution reactions on the isobutylene/para-methylstyrene/parabromomethylstyrene terpolymers has not been prepared, it is obvious that one skilled in the art could attach almost any desired pendant functionality including acrylates and functionalities having radiation reactivity and mixtures of functionalities as desired for various applications, by applying the principles disclosed herein. The attachment of two or more different types of functional groups allows preparation of polymers which can be radiation crosslinked, emulsified, and/or possess improved adhesion to specific substrates as each of these attributes can be derived from the judicious choice of an appropriate functionality.

The "key" requirements for producing the versatile, pendant radiation sensitive backbone saturated, soluble copolymers of this inventions via selective nucleophilic substitution reactions are:

(1) Use of the isobutylene/parahalomethylstyrene/paramethylstyrene base terpolymers for nucleophilic substitutions under appropriate, controlled conditions. The composition of the terpolymer can be varied as desired to yield the desired combination of properties (i.e. $T_g$, hardness, flexibility, impact strength, functionality level, etc.).

(2) Choosing the nucleophile and reaction medium so as to achieve the required intimate contact between the benzylic halogen attached to the base terpolymer and the nucleophile. It should be recognized that in some instances this can be accomplished by using a different solvent or reaction medium for the polymer and for the nucleophile and then employing an appropriate phase transfer catalyst to promote the reaction.

(3) Achieving specific solvation at the reaction site so that the desired nucleophilic substitution reaction is facilitated at mild conditions.

(4) Avoiding "vigorous" or "harsh" reactants or reaction conditions such as strong "hard" bases or high temperatures that would cause a loss in reaction specificity and allow side reactions to become important and/or cause crosslinking or degradation reactions to occur.

(5) Choosing the nucleophilic reagent and promoters appropriately so that the desired substitution reaction occurs quickly under mild conditions and potential undesired side reactions are avoided. For example, in using a carboxylic nucleophile in an esterification reaction to replace the benzylic bromines on an isobutylene/para-methylstyrene/parabromo-methylstyrene base terpolymer, one could choose the potassium salt of the acid as the nucleophilic reagent, along with 18 Crown-6 to solvate the potassium ion and promote the desired esterification substitution reaction, or one could choose the tetrabutylammonium counterion in an appropriate solvent as a nice "soft" salt of the carboxylic acid to promote the reaction, rather than trying to use a "hard" ionic salt of the carboxylic acid as the nucleophilic reagent.

(6) Choosing reaction conditions to minimize sequential reactions by recognizing that the nucleophilic substitution reaction being conducted can itself form attached nucleophilic reagents on the base copolymer backbone and that these already attached nucleophilic reagents can nucleophilically "attack" other unreacted benzylic bromines on the base terpolymer in a sequential manner to consume the desired, already attached new functionality, and at the same time produce undesirable crosslinking and gelation.

Thus, reaction conditions must be chosen such that the unreacted nucleophilic reagent being used in the substitution reaction is either a much stronger, more reactive nucleophile, or is present in great excess over any attached nucleophilic functionality produced in the substitution reaction. For example, it must be recognized that attached basic groups will become available nucleophiles under basic conditions for further reaction with benzylic bromine. These polymeric functional groups can react with other benzylic bromines to consume the already attached pendant functionality and produce undesired interpolymeric crosslinks. The result is gelled polymer instead of the desired pendant functionalized polymer of the invention. Attempting to replace the benzylic bromines of the base terpolymer of this invention with mercaptan groups, it must be recognized that the attached SH (mercaptan) groups will form incorporated mercaptide nucleophilic reagents under basic conditions and these incorporated mercaptide groups will react with other benzylic bromines to consume the already incorporated pendant mercaptan functionality and produce undesired thioether crosslinks resulting in gelled polymer instead of the desired pendant functionalized polymer of the invention.

Likewise, in producing a pendant hydroxy functionalized polymer of this invention, it must be recognized that the attached hydroxy groups will form alkoxide nucleophilic reagents under strongly basic conditions, and these attached alkoxide groups can react in a sequential manner with other unreacted benzylic bromines of the base terpolymer to consume the already attached pendant hydroxy functionality to produce ether crosslinks, resulting in gelled polymer rather than the desired pendant functionalized polymer of this invention.

The key requirement of recognizing the potential for sequential reactions and choosing conditions to minimize them is especially important in cases where it is desired to produce the pendant acrylate/photosensitive functionalized saturated polymers of this invention with mixed pendant functionality. In these mixed functionality polymers, it is extremely important to choose functionalities and conditions such that the desired pendant functionalities are preserved and subsequent reactions are avoided.

The novel versatile, pendant functionalized, backbone saturated, soluble copolymers of this invention which are derived via selective nucleophilic substitution reactions on a base terpolymer comprising isobutylene/para-methylstyrene and parabromomethylstyrene are widely useful as will be further disclosed in the examples dealing with specific pendant functionalities. They encompass a broad range in properties ranging from low $T_g$ elastomers high in isobutylene to high $T_g$ plastics high in paramethylstyrene with tough high impact compositions at intermediate isobutylene contents. The presence of appropriate pendant functionality renders this entire range of products "paintable" for use in external automotive or appliance applications, etc. and enables them to be adhered to and used as coatings on other substrates especially in exterior applications where the excellent environmental resistance of the backbone saturated copolymers is advantageous. The presence of appropriate pendant functionality also enables these compositions to react with or be co-reacted with other functional polymers, or fillers, or fibers to form composite structures (i.e. laminates, dispersions, etc.) with desirable combinations of properties.

In accordance with this invention it has been found that the novel, pendant, acrylate/photosensitive functionalized, saturated copolymers described and exemplified herein can be conveniently and practically produced by first preparing a base terpolymer comprising a saturated hydrocarbon backbone with one or more pendant attached electrophilic moieties, and then attaching the desired new acrylate and/or photosensitive functionalities via a selective nucleophilic substitution reaction with the pendant attached electrophilic moieties. It has been found to be desirable, and is important in obtaining the pendant functionalized copolymer ingredient of this invention, that the pendant attached electrophilic moieties which are replaced by other functionalities via selective nucleophilic substitution reactions be benzylic halogen moieties. These pendant attached electrophilic benzylic halogen moieties can be readily inserted into random isobutylene/para-methylstyrene copolymers by radical halogenation as mentioned previously to yield the base terpolymer containing isobutylene/paramethylstyrene/and brominated para-methylstyrene securing random units. This base terpolymer containing electrophilic benzylic halogen moieties is the "parent" polymer from which the novel, pendant functionalized, backbone-saturated copolymers of this invention are prepared via selective nucleophilic substitution reactions.

These novel pendant functionalized polymers of this invention are comprised of the following "mer" units:

a) enchained isobutylene unit

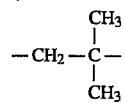

b) enchained p-alkyl-styrene unit

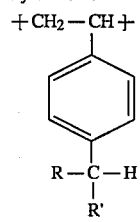

c) enchained brominated p-alkyl-styrene unit (the electrophilic unit)

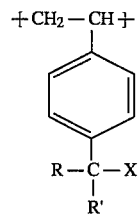

d) enchained pendent acrylate functional group formed via nucleophilic substitution on benzylic halogen

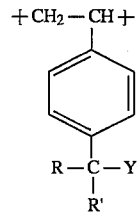

e) enchained pendent photosensitive and/or non-radiation-reactive functional group formed via nucleophilic substitution on benzylic halogen

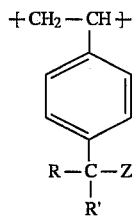

wherein: R and R' are independently selected from the group consisting of hydrogen, alkyl, and primary or secondary alkyl halide, X is a halogen atom (preferably bromine or chlorine, and most preferably bromine), Y represents a new acrylate group attached to the polymer via nucleophilic substitution of one of the benzylic halogens so that an enchained c "mer" unit has become a d "mer" unit, and Z represents a new photosensitive and/or non-radiation-reactive group attached to the polymer via nucleophilic substitution of one of the benzylic halogens so that an enchained c "mer" unit has become an e "mer" unit. Actually, there can be several different Y and/or Z species in the same polymer in cases where mixed acrylate and/or photosensitive functionalities are being introduced. Y and Z are the residues which become attached to the polymer enchained c "mer" unit in place of halogen when a nucleophilic reagent capable of donating electrons to benzyl halides is reacted with the base terpolymer in accordance with this invention.

The four (or more if several different Y and/or Z functionalities are present) "mer" units are attached to one another in random fashion to form the novel, pendant acrylate/photosensitive functionalized, backbone saturated polymer ingredients in the compositions of this invention. Total polymer number average molecular weight can range from <500 to > 100,000. The amounts of the various "mer" can range as follows:

a) (isobutylene)—"mer" units from about 10 to about 99.5 weight percent;

b) (p-alkylstyrene)—"mer" units from about 0.5 to about 90 weight percent;

c) (radically brominated p-alkylstyrene)—"mer" units from 0 to about 55 weight percent;

d) (pendant acrylate-functional p-alkylstyrene)— "mer" units from about 0.05 to about 5 mole percent;

e) (pendant photosensitive functional p-alkylstyrene)— "mer" units such that the photosensitive moiety comprises from about 1 ppm to about 5 percent by weight of the copolymer.

Indeed, there can be several different Y and/or Z species in the same polymer in Cases where mixed acrylate and/or photosensitive functionalities are being introduced. Y and optionally Z are the residues which become attached to the polymer unit in place of halogen when a nucleophilic reagent capable of donating electrons to benzyl halides is reacted with the base terpolymer in accordance with this invention, wherein a) is from about 10 to about 99.5 percent by weight, more preferably from about 65 to about 99 percent by weight, and most preferably from about 80 to about 95 percent by weight, b) is from about 0.5 to about 90.0 percent by weight, more preferably from about 1 to about 20 percent by weight, and most preferably from about 2 to about 10 percent by weight, d) is from about 0.05 to about 5 mole percent, more preferably from about 0.1 to about 2 mole percent and most preferably from about 0.25 to about 1 mole percent, c) is from 0 to about 55.0 percent by weight of the paraalkylstyrene, more preferably from 0 to about 20 percent by weight, and most preferably from 0 to about 15 percent by weight and e) is from 0 to about 55.0 percent by weight, more preferably from 0 to about 20 percent by weight, and most preferably from 0 to about 15 percent by weight, and when e) is a photosensitive functional group the photosensitive moiety (excluding the weight of the benzyl group to which is attached) is from about 1 ppm to about 5 percent by weight of the copolymer, preferably about 100 ppm to about 5000 ppm, and especially from about 1000 ppm to about 2500 ppm. The number average molecular weight of the functionalized polymers is from about 5000 to about 500,000, more preferably from about 50,000 to about 300,000 and most preferably from about 50,000 to about 175,000.

In accordance with an embodiment of the present invention, the nucleophilic reagents which are capable of donating electrons to benzyl halides and to displace a halide ion via a substitution nucleophilic displacement reaction and attach the acrylate functional group Y, and optionally the photosensitive and/or non-radiation-reactive functional group Z, in the benzylic position from which the halogen was displaced may be Y or YM, or Z or ZM, wherein: M is hydrogen, a metal ion, or an ammonium ion and Y and/or Z are either a simple nucleophile containing oxygen, sulfur, silicon, carbon, nitrogen, phosphorus, or various metals; or Y and/or Z are a small molecule of <1000 molecular weight which may contain other functionality in addition to the simple nucleophile which become attached at the benzylic position in the nucleophilic displacement reaction.

Examples of simple nucleophiles containing oxygen which results in the attachment of —O— to the benzylic position from which the halide ion was displaced included, but are not limited to:

| ⁻OR phenoxide | as in alkoxide or |
| ⁻O\C—R // O | as in carboxylates |
| ⁼O₃S | as in sulfonate salts |

Examples of simple nucleophiles containing sulfur which result in attachment of —S— to the benzylic position from which the halide ion was displaced include (but are not limited to):

| ⁻S—R | as in thiolates and thiophenolates |
| ⁻SR₂ | as in thioethers |
| ⁻O\C—R // S | as in thiocarboxylates |
| ⁻S\C—R // S | as in dithiocarboxylates |
| S=C(NR₂)(NR₂) | as in thioureas |

| ⁻S\C—NR₂ // S | as in dithiocarbamates |
| ⁻S\C—OR₂ // S | as in xanthates |
| ⁻SCN | as in thiocyanates |

Examples of simple nucleophiles containing silicon which result in the attachment of —Si— to the benzylic position from which the halide ion was displaced and n=1,2 or 3 include (but are not limited to):

| H—SiR₃ | as in silanes |
| H—SiX$_n$R$_{3-n}$ | as in halosilanes |

Examples of simple nucleophiles containing carbon which result in the attachment of —C— to the benzylic position from which the halide ion was displaced included (but are not limited to):

| CN | as in cyanides |
| CR₃ | as in organo lithium (or other alkali or alkaline earth metals) compounds |
| HC—(R)—(CO₂R)₂ | as in malonates and di- or trisubstituted methane derivatives in general in which the substituents activate the substituents methane carbon for carbon-alkylation reactions under basic conditions. |

Examples of simple nucleophiles containing nitrogen which result in the attachment of —N— to the benzylic position from which the halide ion was displaced and n=0,1,2 or 3 (include but are not limited to):

| R \| HN—C—R ‖ O | as in amides |
| NH$_n$R$_{3-n}$ | as in various amines |
|  | as in carbazoles |

-continued

| | |
|---|---|
| 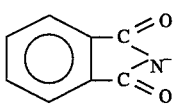 | as in phthalimides |
|  | as in pyridine |
| 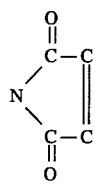 | as in maleimide |
| 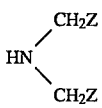 | where Z is some functional group as in iminodiethanol, iminodiacetonitile, iminodiacetic acid, etc. |
| ⁻N=C=O | as in cyanates |

Examples of simple nucleophiles containing phosphorous which result in attachment of —P— to the benzylic position from which the halide ion was displaced and n=0,1,2 or 3 (include but are not limited to):

| | |
|---|---|
| $PH_nR_{3-n}$ | as in various phosphines |

Examples of simple nucleophiles containing a metal which results in the attachment of —M— to the benzylic position from which the halide ion was displaced include (but are not limited to):

| | |
|---|---|
| Mg— | (anthracene complex in THF) |
| Li— | (appropriately complexed) |

Examples in which Y and/or Z are a small molecule of <1000 molecular weight containing other functionality in addition to the simple nucleophile which becomes attached at the benzylic position from which the halide ion was displaced in the nucleophilic displaced reaction include (but are not limited to): triethanol amine, iminodiacetic acid, iminodiacetonitrile, iminodiethanol, vinyl pyridines, cinnamate, eleostearate, linoleate, acrylate, methacrylate, benzoyl benzoate, benzoyl phenolate, dihydroxybenzophenone, crown ethers derivatives, cryptand derivatives, cellulose derivatives, sugar derivatives, low molecular weight polyethylene oxide or polypropylene oxide chains with terminal nucleophilic groups, etc. It should be noted that these reactions in which Y and/or Z contain other functionalities in addition to the simple nucleophile which becomes attached at the benzylic position from which the halide ion was displaced greatly extend the type and range of functionalities which can be incorporated into the novel pendant functionalized, backbone-saturated copolymers of this invention, as prepared by selective nucleophilic substitution reactions. This ability to attach multifunctional Y and/or Z groups enables clusters of polar groups to be attached as is desirable in dispersants of various type (i.e. lube oil dispersants); enables functionalities that are not readily achieved by the nucleophilic displacement reaction to be attached; and enables very complex and special functionalities such as chiral compounds or crown compounds of cryptands to be attached to produce novel pendant functionalized copolymers of this invention with unique properties for highly specialized applications such as catalysts and so forth.

However, it should also be noted that attachment of Y and/or Z groups containing other functionalities requires even greater care during the nucleophilic displacement reaction by means of which the Y and/or Z groups are attached to insure that the new functionalities are preserved and are not consumed by sequential reactions to produce unintended crosslinking or gelation. In some instances, it may be desirable to block the functionalities that need to be preserved until the nucleophilic substitution reaction is completed.

Most nucleophilic substitution reactions of this type also involve some degree of side reactions which can be extremely detrimental in making the pendant functionalized soluble copolymers of this invention, since even minor amounts of side reactions in high polymers can lead to unintended gelation which can greatly diminish utility. One advantage of using the unique base polymers of this invention for the nucleophilic substitutions reactions is that the undesired side reactions can be largely eliminated. It is known that nucleophilic substitution reactions can proceed by several different mechanisms, and with most electrophiles these different mechanisms can lead to different products or to different amounts of side reactions.

Those reactions which proceed by a concerted $SN_2$ mechanism usually yield more of the desired substitution product than those proceeding by an $SN_1$ mechanism. An advantage of using the enchained benzylic halogen of this invention as the electrophile site for nucleophilic substitution is that elimination reactions are entirely prevented so that even nucleophilic substitution reactions proceeding by an $SN_1$ mechanism still lead selectively to the desired substitution product without undesired side reactions.

A further advantage of using the preferred benzylic bromine of this invention as the site for nucleophilic substitution is that the substitution reactions proceed under mild conditions (since the benzylic bromine is so labile) so that degradation of the polymer backbone or thermal rearrangement or decomposition of the reactants or products can be avoided. Utilization of benzylic halogen, especially benzylic bromine, as the enchained electrophile site for nucleophilic substitution as in this invention also makes it possible to select reagents and conditions so that other side reactions, such as those proceeding by another mechanism or the sequential reactions can be largely eliminated so that the soluble pendant functionalized copolymers of this invention can be prepared by selective $SN_2$ nucleophilic substitution reactions. Careful observance of the six "key" requirements already outlined is necessary in order to prepare the acrylate-functionalized backbone saturated, soluble polymers if this invention.

The exact and specific conditions suitable for preparing the various pendant acrylate/photosensitive functionalized, soluble copolymers of this invention will vary depending upon the new functionality being introduced, as well as the base copolymer composition and other factors, and some experimentation may be necessary to define practical conditions in each case, but the same key factors as outlined herein must always be considered and observed. This will become clearer in the specific examples to follow, but some general reaction conditions can first be defined.

The nucleophilic substitution reactions can be run in solution using a solvent system in which both the base polymer and nucleophilic reagent are soluble; can be run in a two-phase liquid run system with the base polymer dissolved in one phase and the nucleophilic reagent in the other; can be run in a two-phase solid/liquid system (i.e. with the base polymer dispersed in a liquid phase containing the nucleophilic reagent); or can be run in bulk with reactants dissolved or dispersed in the base polymer. The common solution situation is most controllable and generally the preferred case, but the bulk reaction may be economically advantageous in some cases where suitable reagents and reaction conditions can be found.

The intermediate two-phase systems may be advantageous under some circumstances and may be necessary in instances where the solubility parameters of the base polymer (containing the electrophile) and the nucleophilic reagent are so different that no common solvents exist. In these two-phase cases, it is often or usually desirable to use phase transfer catalysts to promote the nucleophilic substitution reaction at the interface between the phases or to transport the nucleophilic reagent to the electrophile site in the base polymer. A most preferred way of preparing the pendant functionalized polymers of this invention is to radically halogenate a random isobutylene/para-methylstyrene copolymer, as taught previously, to introduce the benzylic halogen electrophile, and then conduct the nucleophilic substitution reaction to introduce the desired new functionality in the same medium in a sequential reaction (halogenate and then nucleophilically displace the halogen) without ever recovering the base halogenated polymer separately.

Depending upon the reactivity of the nucleophilic reagent used and the reaction conditions, the nucleophilic substitution reactions can be run at temperatures varying from about 0° C. to about 200° C. as limited by thermal stability of the nucleophilic reagent, the base polymer and the functionalized product polymer. Normally, temperatures between about 0° C. and about 150° C. are preferred. Reaction times are normally (but not necessarily) chosen to allow the nucleophilic displacement reaction to go to completion (i.e. exhaustion of either the electrophile or the nucleophilic reagent) and may range between several seconds and a few days. Normally, reaction times between a few minutes and several hours are preferred and reaction temperature and other conditions are set to make a convenient reaction time possible.

A wide range of solvents and/or solvent blends may be used as the medium in which the nucleophilic displacement reaction is run and it is this factor which determines whether a solution, dispersion, or bulk reaction is conducted. A number of factors are important in selection of the solvents. They need to be inert under the reaction conditions, easily removed from the product, easily recycled for reuse in the process, of low toxicity under use conditions with minimum environmental health concerns, and economical to use. In addition, the solvents need to provide a reaction environment which is favorable for the reaction being run, that is, they must bring the reactants into the required intimate solution contact and should provide solvation stabilization for intermediate states along the desired reaction route. It is frequently necessary or desirable to use a blend of solvents to best achieve the various compromises required, with one solvent being an easily-handled good solvent for the base polymer and the other being a good solvent for the nucleophilic reagent and/or providing solvation stabilization for the reaction intermediates. It is most preferred that the chosen solvent system be one that is suitable for both the radical halogenation reaction to introduce the benzylic halogen electrophile into the random isobutylene/para-methylstyrene copolymer, as well as for the nucleophilic substitution reaction to introduce the new pendant functionality, so that a sequential reaction route is feasible without having to recover the halogenated base polymer separately.

Solvents which are particularly suited for this sequential reaction route vary somewhat depending upon composition of the base polymer, but with the eiastomeric base polymers high in isobutylene are the low boiling saturated hydrocarbons ($C_4$–$C_7$) or halogenated hydrocarbons ($C_1$–$C_7$). Often it is desirable to add a more polar cosolvent, such as a low boiling alcohol ($C_1$–$C_4$) during the (second) nucleophilic displacement reaction in order to dissolve and carry-in the nucleophilic reagent, as well as provide solvation stabilization for the nucleophilic displacement reaction. Aromatic solvents such as benzene, toluene, and chlorobenzene are generally good solvents for the base polymer over the entire composition range and provide a reaction medium favorable for many nucleophilic displacement reactions, but often present other problems (i.e. the toxicity of benzene or the high reactivity of toluene during radical halogenation which makes it unsuitable as the reaction medium during this first stage of the sequential reaction route). Preferred solvent composition changes as composition of the base polymer is changed and depends upon whether it is desired to run the reactions in solution or dispersion. In general, solvents of higher solubility parameter containing some aromaticity or halogen are required for solution reactions with the tougher, higher $T_g$ base polymers of this invention which contain higher paramethylstyrene contents.

Similar considerations apply when considering the nucleophilic displacement reaction separately. In order to run this reaction in solution, a good solvent for the base polymer (depending upon its composition) is required and a cosolvent for the nucleophilic reagent may also be desirable or required. Good solvents for the base polymer are similar to those cited above as being suitable for the sequential reaction route, but a broader range of solvents can be considered since inertness during radical halogenation is not required. The low boiling saturated hydrocarbons ($C_4$–$C_7$) or halogenated hydrocarbons ($C_1$–$C_7$) and aromatic hydrocarbons or naphthenes are preferred. Where greater solvent polarity is desired, tetrahydrofuran can be employed or good solvating agents such as dimethyl formamide or dimethyl sulfide can be added. The latter solvents are also good solvents for many of the nucleophilic reagents and may be employed along with alcohols or ketones to dissolve the nucleophilic reagent for addition to the base polymer solution. This technique of adding a solution of the nucleophilic reagent (in a solvent miscible with that used for the base polymer) with rapid stirring to the base polymer solution often results in a fine dispersion of the nucleophilic reagent so that even in cases where the nucleophilic reagent is not completely soluble in the mixed solvent resulting after the addition, a nucleophilic displacement reaction can still be run because the nucleophilic reagent dissolves during reaction to replenish the solution concentration as the reaction progresses.

In more extreme cases, where the nucleophilic reagent is not soluble in co-solvents miscible with the base polymer solvent, or where the solubility of the nucleophilic reagent in mixed solvency (which will retain the base polymer in solution) is too low, then a two- phase reaction may be run with the base polymer dissolved in one phase and the nucleophilic reagent in the other. In such cases, good mixing is essential to provide lots of interfacial contact between the reactants, and a phase transfer catalyst is generally desirable to aid in transporting the nucleophilic reagent to the benzylic halogen electrophile site on the base polymer. An example might be highly polar water soluble nucleophilic reagents such as potassium cyanide, sodium sulfite, or nitrilotriacetic acid. Examples of phase transfer catalysts useful in these two phase reactors include (but are not limited to): tetrabutylammonium bromide, tetrabutylammonium bisulfate, tetrabutylammonium hydroxide, benzyl triethylammonium chloride, tetrabutyl- phosphonium bromide, crown ethers, cyptands, Adogen 464, etc. These same types of materials are sometimes beneficial in speeding up the one-phase solution reaction by providing specific solvation at the reaction site.

The most convenient reaction condition is to run a bulk reaction with the nucleophilic reagent dissolved or dispersed in the base polymer. Working with high solids eliminates the costs of solvent handling and recycle. However, the bulk reaction requires use of an expensive inefficient reactor such as an extruder which is capable of providing mixing in highly viscous systems and restricts the reaction medium so that only selected nucleophilic displacement reactions are possible, and even those are more prone to involve side reactions because of the more restrictive conditions and poorer mixing which prevails during reaction.

In addition to the general reaction considerations already discussed, the factors known to influence nucleophilic substitution reactions (by those skilled in the art) may be applied in making the pendant functionalized polymers of this invention without materially affecting the invention. Thus, reaction routes and activation energy can be controlled by specific solvation, or catalysts, undesired reactions can be prevented by blocking, etc.

EXAMPLES

These examples describe the specific preparations of several derivatives of the benzylic bromide copolymer and their uses in adhesive and other coating applications.

Gel refers to the insoluble residue of rubber in the adhesive and is determined by exhaustive solvent extraction of soluble polymer in refluxing toluene or xylene for about 72 hours, then drying and weighing the remaining residue.

The coatings were prepared by dissolving the polymers or formulations in toluene (30 weight percent solids) and knife coating onto MYLAR or release paper. The coating thicknesses were then dried and irradiated. The coatings thicknesses were typically 1.5 mil. UV irradiation was conducted on an American Ultraviolet Mini-Conveyorized Curing System. UV dosages were determined using the UVA cure radiometer manufactured by EIT. EB crosslinking was performed on an Energy Sciences CB-150 Electrocurtain Electron Beam Accelerator.

Example 1

Preparation of Brominated Base Polymer

A sample isobutylene/para-methylstyrene/para-bromomethylstyrene base terpolymer was prepared as follows:

A 500 ml reaction flask fitted with a thermometer, stirrer, and dropping funnel was set up in a glove box having an oxygen- and moisture-free nitrogen atmosphere, and the flask was cooled to −98° C. by immersion in a controlled temperature liquid nitrogen cooled heat transfer bath. The reactor was charged with 386.6 g purified dry methyl chloride (having a purity of 99.8%), 47.4 g purified, dried and distilled polymerization grade isobutylene (having a purity of 99.9%), and 2.6 g purified, dried and vacuum-distilled para-methylstyrene (2.5 mole % of total monomers). Seventeen ml of a catalyst solution consisting of 0.19 weight percent ethyl aluminum dichloride (EADC) in methyl chloride was allowed to drip slowly into the feed blend from the dropping funnel over the course of 12 minutes while stirring and attempting to maintain temperature by immersion of the reactor in the heat transfer bath. Despite the efforts at cooling, reactor temperature rose from −98° C. to −80° C. due to the exothermic polymerization reaction, and a slurry of polymer in a slightly tannish-colored liquid was formed. Some of the polymer agglomerated on the stirrer and reactor walls. The reactor was quenched by adding 25 ml of cold methanol to yield an agglomerated mass of white polymer in a clear colorless liquid. The polymer was recovered by allowing the methyl chloride to flash off and kneading and washing the polymer in methanol; 0.2 weight percent butylated hydroxytoluene (BHT) was added as an antioxidant and the polymer was dried in a vacuum oven at 80° C. Fifty grams of dried white, opaque, tough, rubbery polymer were recovered. Conversion was 100% with a quantitative recovery of the polymer. Catalyst efficiency was about 1550 grams of polymer/gram of EADC. The recovered polymer had a viscosity average molecular weight (My) of 458,000, and contained 5.2 weight percent (2.5 mole percent) para-methylstyrene. Gel permeation chromatography (GPC) analysis using ultraviolet (UV) and refractive index (RI) detectors showed the para-methylstyrene to be uniformly distributed over the entire molecular weight range indicating that a compositionally homogeneous copolymer had been formed.

The GPC was performed using a Waters 150-C ALC/GPC (Millipore Corporation) with a Waters LambdaMax Model 481 LC UV Spectrophotometer on line. Data were collected and analyzed using customized software developed with Computer Inquiry Systems, a division of Beckman Inc. Tetrahydrofuran was used as the mobile phase at various flow rates, but generally 1.0 ml/min. The instruments operated at 30° C. at a wavelength of about 254 nm for the UV. The polyisobutylene backbone has negligible absorbance compared to the aromatic ring at this wavelength. Columns used were m Styragel (Waters) or Shadex (Showa Denko). Sets of columns of wide porosity range were calibrated with narrow molecular weight distribution polystyrene standards with molecular weights from $10^3$ to $4 \times 10^6$. Molecular weights are reported in terms of the polyisobutylene backbone using a universal calibration. The output from the UV and differential refractometer detectors can be compared quantitatively to calculate deviations in composition from the mean. Generally, viscosity average molecular weights are based on separate measurements in diisobutylene at 20° C.

The high molecular weight random uniform copolymer of para-methylstyrene and isobutylene prepared as above was dissolved in dried normal hexane in a two-liter baffled and jacketed resin flask set up for bromination with a four-neck resin flask top. An air-driven turbine mixer was used to provide efficient mixing, and a thermometer and thermocouple were used to measure and control the temperature, which was adjusted as noted hereinbelow by circulating a controlled temperature heat transfer fluid through the jacket. One of the necks was used for mounting a dropping funnel containing the bromine solution, which was added dropwise into the reactor. The funnel and reactor were foil-wrapped to exclude light. A nitrogen bubbler tube with a sintered glass frit at the end was mounted in one of the necks, with the frit immersed in the reactor solution to provide nitrogen sparging at a rate which was set and controlled by a rotometer. The fourth neck was connected by plastic tubing to a knock-out trap and caustic scrubber in order to maintain several inches of water positive pressure during reaction, and to absorb and neutralize any HBr and bromine vapors given off during the reaction.

The bromine solution was prepared by adding a weighed amount of bromine to pure mole-sieve dried n-hexane (essentially olefin-free) in the dropping funnel, and mixing to form less than a 30% solution. The foil-wrapped (to protect from the light) bromine dropping funnel was then mounted on the stirred, temperature-contrOlled, nitrogen-purged reactor, and a 500 watt tungsten light bulb was mounted immediately next to the reactor. The reactor was heated to 40° C. and the bromine solution added dropwise. The bromine charge was 5 percent by weight of the copolymer, and the reaction occurred rapidly as the bromine was added, as evidenced by rapid HBr evolution and rapid fading of the color of the solution. Bromine was added over the course of two minutes, and the reaction was quenched with excess caustic ten minutes after bromine addition had been initiated. The quenched solution then was washed with water, and the brominated copolymer was recovered by alcohol precipitation and vacuum oven drying as previously described. BHT and tetramethylthiuram disulfide were mixed into the copolymer at 0.1% by weight as stabilizers prior to drying. The recovered brominated copolymer was soluble in diisobutylene, had an $M_v$ of 254,000, and included 1.26 wt. % bromine as measured by Dietert analysis. Analysis using 400 MHz NMR showed the presence of 0.9 mole % benzylic bromide group, with no other brominated structures detectable. GPC analysis using UV and RI detectors showed the brominated copolymer to be a uniform, homogeneous compositional distribution, narrow molecular weight distribution ($M_w/M_n \sim 2$) functional copolymer.

Example 2

Preparation of Pendant Functionalized Isobutylene/Para-methylstyrene Copolymer Containing Various Ester Functionalities Example 2A In this example, pendant cinnamate ester functionality was attached to a random isobutylene/para-methylstyrene/para-bromomethylstyrene base terpolymer by nucleophilic substitution using a cinnamic acid salt as the nucleophilic reagent. The base terpolymer used in this example was identical to that used in Example 4A and contained 0.9 mole percent brominated para-methylstyrene, 1.4 mole percent paramethylstyrene, and 97.7 mole percent isobutylene with a $M_v$ of 135,000.

In the nucleophilic substitution reaction, 750 g of the base terpolymer was dissolved in 3000 g of toluene in a 5 l resin flask with an attached air condenser by stirring under $N_2$ to form a 20 weight percent solution. Next, 35.4 g of cinnamic acid (1.5 moles/mole bromine), 77.3 g of 40 weight percent tetrabutyl ammonium hydroxide solution in methanol (0.5 mole/mole acid) and 9.6 g of 50 weight percent sodium hydroxide solution in water (0.5 mole/mole acid) were stirred in and the resulting emulsion was heated to a reflux temperature of 86° C. under constant stirring. The solution was refluxed for 3 hours at 86° C. to complete the reaction with samples removed at the initial reflux point and after ½ and 1-½ hours of refluxing to monitor the progress of the reaction. The solution gradually became clearer during the reaction. After three hours it was a translucent, light beige color. The final solution and samples were given acidic, basic and neutral washes. Then the polymer was recovered by precipitation and kneading in isopropanol as in earlier examples and vacuum oven dried at 70° C. with a 0.2 weight percent BHT mixed in as an antioxidant. Analysis was conducted using a Princeton-Gamma Tech Bromine analyzer and is summarized below for bromine remaining in the starting polymer against reaction extent shows that the nucleophilic substitution reaction was proceeding slowly and had still not gone to completion after three hours of refluxing:

| Reaction Progression | Wt. % Bromine |
|---|---|
| Starting base terpolymer | 1.60 |
| At point of reflux | 1.37 |
| ½ hour later | 1.08 |
| 1½ hours later | 0.91 |
| (final) 3 hours later | 0.54 |

The final product following three hours of reflux contained 0.8 mole percent cinnamate ester and 0.1 mole percent benzylic bromide. The nucleophilic substitution reaction was about 90 percent complete:

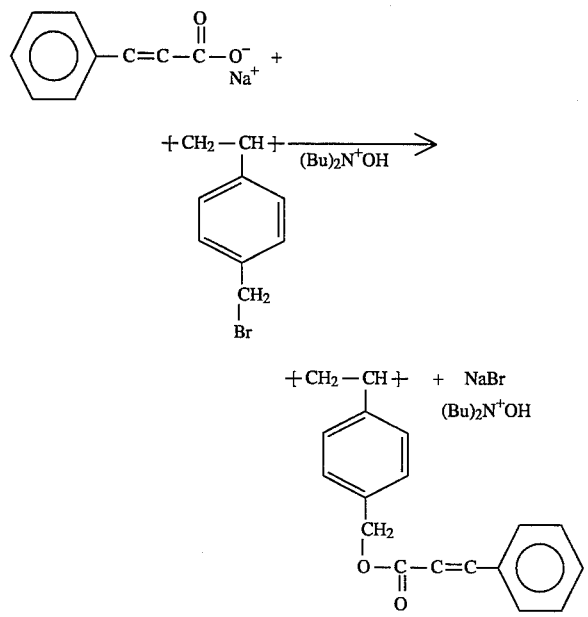

Proton NMR spectoscopy was used to quantify the amount of cinnamate ester functionality introduced:

| NMR Resonance | |
|---|---|
| PROTON | RESONANCE (ppm) |
| ⟨⟩—CH₂O—C(=O)—CH=CH—⟨⟩ ↑ | 5.2 |

| NMR Resonance | |
|---|---|
| PROTON | RESONANCE (ppm) |
| ⟨phenyl⟩–CH$_2$O–C(=O)–CH=CH–⟨phenyl⟩ (arrow at CH=CH, first position) | 6.48 |
| ⟨phenyl⟩–CH$_2$O–C(=O)–CH=CH–⟨phenyl⟩ (arrow at CH=CH, second position) | 7.73 | with, of course, the new aromatic protons also being present in the spectrograph.

This experiment showed that pendant carboxylic acid ester functionality can be introduced into the base terpolymer of this invention by nucleophilic substitution under suitable conditions. The cinnamate ester functionality enables crosslinking to occur when the polymer is irradiated by actinic radiation.

Example 2B

In this example, pendant fatty acid ester functionality was attached to a random isobutylene/para-methylstyrene/para-bromomethylstyrene base terpolymer by nucleophilic substitution using a commercial $C_{18}$ fatty acid in linolenic acid (INDUSTRENE 120 from Witco Corporation) as the fatty acid. The base terpolymer used had a Mooney viscosity of 30 and contained 2 mole percent para-bromomethylstyrene, 5 mole percent para-methylstyrene, and 93 mole percent isobutylene.

In the nucleophilic substitution reaction, 500 g of the base terpolymer was dissolved in 2833 g of toluene in a 5 l resin flask with an attached air condenser under nitrogen pad to form a 15 weight percent solution. Then 63.3 g of INDUSTREEN 120 Linseed fatty acid (1.2 moles/mole Br) was added along with 72.8 g of 40 weight percent tetrabutyl ammonium hydroxide solution in methanol (0.5 moles/mole acid) and 9 g 50 percent NaOH solution in water (0.5 moles/mole acid). The emulsion that formed was opaque and slightly yellowish. Next, it was heated to the reflux temperature at 87° C. under nitrogen with stirring. The emulsion was refluxed for 2 hours with samples being removed at the reflux point, after ½ hour and after 1 hour of refluxing to monitor the progress of the reaction. During the reaction, the reaction solution became clearer with water droplets being distilled over into the condenser. The final solution was translucent with a light yellow color. The reaction samples and final reaction effluent were given acidic, basic, and then neutral water washes before the polymer was precipitated in isopropanol and vacuum oven dried as before. Analysis below, as in Example 2A, for bromine remaining in the starting polymer indicates that the nucleophilic substitution with the $C_{18}$ fatty acid was faster than with the cinnamic acid salt and was essentially complete in one hour. Apparently the carboxylate nucleophile attached to the $C_{17}$ hydrocarbon more easily achieved necessary intimate contact with the benzylic bromine electrophile attached to the base terpolymer than the carboxylate group attached to a shorter aryl group.

| Reaction Progression | Wt. % Bromine |
|---|---|
| Starting Base Terpolymer | 3.0 |
| At Reflux | 1.06 |
| ½ Hour Later | 0.45 |
| 1½ Hours Later | 0.29 |
| (Final) 3 Hours Later | 0.23 |

NMR analysis showed that the final product contained 2 mole percent ester and essentially no benzylic bromine indicating that the nucleophilic substitution reaction had gone to completion. (Small residual bromine content measured by the bromine analyzer probably represented inorganic bromides not thoroughly washed out during recovery steps). The NMR spectrum (below) shows a resonance due to the benzylic ester protons at 5.08 ppm and a broad complicated resonance due to the olefinic protons in the $C_{18}$ chain at 5.3–5.5 ppm.

| NMR Resonance | |
|---|---|
| PROTON | RESONANCE (ppm) |
| ⟨phenyl⟩–CH$_2$–O–C(=O)–C$_{17}$H$_{35}$ (arrow at CH$_2$) | 5.08 |
| ⟨phenyl⟩–CH$_2$–O–C(=O)–C$_{17}$H$_{35}$ (arrow at C$_{17}$H$_{35}$) | 5.35–5.55 |

In comparison, the benzylic ester protons of the cinnamate ester of Example 2A showed a higher field resonance at 5.2 ppm due to the conjugation present in the cinnamate ester.

The fully converted linseed oil acid ester derivative of this example remained completely soluble and showed no evidence of vulcanization crosslinking when compounded and heated under typical vulcanization conditions with zinc oxide or promoted-zinc oxide vulcanization systems which are effective with the starting brominated "base" terpolymer and another confirmation of the absence of any remaining benzylic bromines. The functionalized polymer, however, gave good vulcanizates when compounded and cured with typical sulfur vulcanization system below:

| Polymer | 100 |
|---|---|
| Sulfur | 1.25 |
| M. Tudds | 1.50 |
| Altax | 1.00 |
| Zinc Oxide | 3.00 |

The presence of unsaturation in the pendant fatty acid side chains thus permits conventional sulfur vulcanization systems to be employed to vulcanize the functionalized ester derivative of this example. The pendant unsaturation is also useful in permitting covulcanization with the high unsaturation general purpose rubbers such as natural rubber or SBR. Testing of sulfur vulcanized specimens of this ester derivative in a standard ozone resistance test showed that they retained the outstanding ozone resistance characteristic of the saturated base terpolymer vulcanizates. The pendant unsaturation in the side chain thus imparts conventional

EXAMPLE 3

In this example, pendant fatty acid ester functionality in which the fatty acid contained conjugated unsaturation was attached to the base terpolymer. The fatty acid used was derived from Tung oil and was high in eleostearic acid. The base terpolymer had a Mooney viscosity of 32 and contained 3.6 weight percent bromine, 2.2 mole percent para-bromomethylstyrene, 2.7 mole percent para-methylstyrene, and 95.1 mole percent isobutylene. In the nucleophilic substitution reaction, 666 g of a "wet" base terpolymer crumb (500 g dry weight) were dissolved in 283 g toluene in a 5 L resin flask with an attached air condenser to yield a 15 weight percent polymer solution containing dispersed water. This use of the "wet" crumb in the nucleophilic substitution reaction was advantageous as it avoided the need to finish the brominated "base" terpolymer prior to converting it to the pendant functionalized polymer. To the polymer solution was added 76 g of Tung oil acid (~1.2 moles/mole bromine), 87.4 g of 40 weight percent tetrabutyl ammonium hydroxide solution in methanol (0.5 moles/mole acid) and 43 g of 50 weight percent sodium hydroxide solution in water (0.2 moles/mole acid) to give a milky white emulsion which was heated to a reflux temperature of about 84° C. The reaction mixture was allowed to reflux for one hour under constant stirring before being cooled, washed and recovered as previously outlined. Samples removed at the reflux point and ½ hour later were similarly recovered.

The substitution reaction was proceeding rapidly under these conditions as shown by the following bromine analysis:

| Reaction Progression | Wt. % Bromine |
| --- | --- |
| Starting Base Terpolymer | 3.6 |
| At the Reflux Point | 0.78 |
| ½ Hour Later | 0.56 |
| (Final) 3 Hours Later | 0.40 |

The NMR spectrum shows a resonance due to the benzylic ester protons at 5.08 ppm, some residual resonance at 4.47 ppm due to remaining benzylic bromide, and a series of resonances at 5.3–6.4 ppm due to the olefinic protons of the $C_{18}$ acid (with the conjugated unsaturation resonances being the high field resonances at >5.9 ppm). The final product contained 1.9 mole percent ester with 0.2 mole percent benzylic bromide remaining. It was completely soluble in toluene with a Mooney viscosity of 31 which was the same as the starting base terpolymer.

Despite the highly active nature of the pendant conjugated unsaturation, this functionalized polymer showed good stability with no tendency to crosslink during drying or storage. However, the attached conjugated unsaturation permitted facile vulcanization and covulcanization with unsaturated rubbers using sulfur vulcanization systems. The conjugated unsaturation also provided good crosslinking under electron beam irradiation and oxidative surface curing upon outdoor exposure to sunlight. This is a highly desirable property in exterior coatings such as roof coatings. The conjugated unsaturation is also very active in radical reactions thus permitting grafting reactions with free radical polymerizable monomers. This highly active Tung oil acid ester derivative is useful in a wide range of applications.

It is obvious that nucleophilic substitution reactions with various carboxylic acids could be used to attach many other functional side chains such as hydroxy using ricinoleic acid, etc.

EXAMPLE 4

In the following example, a methacrylic acid derivative of isobutylene/para-methylstyrene/para-bromomethylstyrene base terpolymer was prepared similarly by the following procedure:

A 5000 ml glass-jacketed reaction vessel fitted with an overhead stirrer, a hose connector and a septum was purged with nitrogen. At room temperature under nitrogen, the vessel was charged with toluene (2500 ml) and 450 g of the base isobutylene/para-methylstyrene/para-bromomethylstyrene terpolymer comprising 2.4 mole percent total para-methylstyrene, including 1.10 mole percent para-bromomethylsytrene, and having a Mooney viscosity of 32 (1+8 min., 125° C.). The base terpolymer was dissolved by stirring at room temperature overnight. A tetrabutylammonium salt of methacrylic acid was prepared in a second flask by charging 101.3 ml tetrabutylammonium hydroxide (1.0 M in methanol) and 8.7 (8.6 ml) methacrylic acid to the flask and swirling the contents of the flask at room temperature, giving a water-white clear solution. This solution was then added to the flask containing the dissolved base terpolymer, at a circulating bath temperature of 83° C. After 45 minutes, the bath temperature was raised to 95° C. and let to run for 7.5 h. Then the bath temperature was lowered to 70° C., and after a 2.5 h period, the reaction was let to cool. The yellowish viscous solution was quenched and washed with 10 ml HCl in 1000 ml deionized water, and subsequently washed with $H_2O$/IPA (70:30) 5 to 6 times. The polymer was isolated by precipitation into 0.1% BHT in isopropanol (IPA) and dried in vacuo for 48 h at 1 mm Hg and 80° C. Solution viscosity of the recovered material was identical to the starting material, and $^1$HNMR (400 MHz, $CDCl_3$) analysis of the methacrylate-functionalized polymer indicated quantitative conversion to the grafted species. The results of NMR analysis are detailed in Table A.

EXAMPLE 5

In the following example, an acrylic acid derivative of isobutylene/para-methylstyrene/para-bromomethylstyrene base terpolymer was prepared similarly by the following procedure:

A 5000 mL glass-jacketed reaction vessel fitted with an overhead stirrer, a hose connector and septum was purged with nitrogen. At room temperature under nitrogen, the vessel was charged with toluene (2500 mL) and 450 g of the base isobutylene/para-methylstyrene/para-bromomethylstyrene terpolymer comprising 2.4 total mole percent para-methylstyrene, including 1.10 mole percent para-bromomethylstyrene, and having a Mooney viscosity of 32 (1+8 min., 125° C). The base terpolymer was dissolved by stirring at room temperature overnight. A tetrabutylammonium salt of acrylic acid was prepared in a second flask by charging 101.3 mL tetrabutylammonium hydroxide (1.0 M in methanol) and 7.3 (7.0 mL) methacrylic acid, and 30 mL of methanol to the flask and stirring at room temperature to give a water-white clear solution. This solution was then added to the flask containing the dissolved base terpolymer, at a circulating bath temperature of 83° C. After 45 minutes, the bath temperature was raised to 95° C. and let to run for 7.5 h. Then the bath temperature was lowered to 70° C., and after a 2.5 h period, the reaction was let to cool. The yellowish viscous solution was quenched and washed with 10 mL HCl in 1000 mL deionized water, and subsequently washed with H$_2$O/IPA (70:30) 5 to 6 times. The polymer was isolated by precipitation into 0.1% BHT in isopropanol (IPA) and dried in vacuo for 48 h at 1 mm Hg and 80° C. Solution viscosity of the recovered material was identical to the starting material, and $^1$HNMR (400 MHz, CDCl$_3$) analysis of the acrylate-functionalized polymer indicated quantitative conversion to the grafted species. The results of NMR analysis are detailed in Table A.

tetrabutylammonium salt was prepared by charging 101.3 mL tetrabutylammonium hydroxide (1.0 M in methanol), 8.3 g (8.2 mL) methacrylic acid, 1.01 g 4-hydroxybenzophenone, and 100 mL isopropanol to a second flask and stirring at room temperature to give a translucent yellowish solution. This mixture was then added to the polymeric cement, as in Example 4. The polymer was isolated by precipitation in isopropanol with 0.1% BHT stabilizer optionally added. $^1$HNMR (400 MHz, CDCl$_3$) analysis confirmed 97.3% conversion of benzylic bromide to grafted species. These results are given in Table A.

TABLE A

| EX. | PMS, wt % (Base Polymer) | GRAFT | UNGRAFTED PMS, (mol %) | MOONEY (1 + 8 min., 125° C.) | Br—PMS (mol %) | % AA (m) | % MA (m) | % BZ (m) |
| --- | --- | --- | --- | --- | --- | --- | --- | --- |
| A-1 | 5 (2.4 MOLE %) | AA | 1.33 | 32 | | 0.75 | | |
| A-2 | 5 | MA | 1.43 | 32 | | | 0.81 | |
| A-3* | 5 | (7.6% BZ/ 92.4% AA) | 1.26 | 32 | 0.08 | 0.73 | | 0.06 |
| A-4* | 5 | (7.3% BZ/ 92.7% MA) | 1.26 | 32 | 0.03 | | 0.88 | 0.07 |
| A-5 | 5 | BZ | 1.80 | 32 | 0 | | | 0.50 |
| A-6 | 5 | BZ | 1.46 | 35 | 0.04 | | | 0.89 |
| A-7* | 5 | (54% AA/ 46% BZ) | 1.20 | 32 | 0.06 | 0.23 | | 0.22 |
| A-8* | 5 | (46% MA/ 54% BZ) | 1.24 | 32 | 0.09 | | 0.31 | 0.33 |
| A-9* | 5 | (77% MA/ 23% BZ) | 1.19 | 32 | 0.0 | | 0.58 | 0.20 |
| A-10* | 5 | (62% MA/ 37% BZ) | 1.24 | 32 | 0.0 | | 0.58 | 0.38 |
| A-11 | 5 | BZ | 1.26 | 29 | 0.06 | | | 0.90 |
| A-12 | 5 | BZ | 1.47 | 32 | 0.0 | | | 1.10 |

Key:
BZ = 4-hydroxybenzophenone
MA = methacrylic acid
AA = acrylic acid
(1) mole % ether = 1.35
*= invention Invention Example 6

In the following example, a terpolymer derivative having 0.73 mole % acrylate and 0.06 mole % benzophenone (graft ratio 92.4%:7.6% acrylate:benzophenone) substituted on the PMS was prepared by a procedure similar to Example 5 except that the tetrabutylammonium salt was prepared by charging 101.3 mL tetrabutylammonium hydroxide (1.0 M in methanol), 6.9 g (6.3 mL) acrylic acid, 1.01 g 4-hydroxybenzophenone, and 200 mL isopropanol to a second flask and stirring at room temperature to give a white solution. This mixture was then added to the polymeric cement, as in Example A-4. The polymer was isolated by precipitation in isopropanol with 0.1% BHT stabilizer optionally added. $^1$HNMR (400 MHz, CDCl$_3$) analysis confirmed 92.7% conversion of benzylic bromide to grafted species. These results are given in Table A.

Invention Example 7

In the following example, a terpolymer derivative having 0.88 mole % methacrylate and 0.07 mole % benzophenone (graft ratio 92.7%:7.3% methacrylate:benzophenone) was prepared by a procedure to Example A-3 except that the Examples A-1 to A-9

Starting with an isobutylene/para-methylstyrene/para-bromomethylstyrene base terpolymer as outlined in Example 1, derivatives of 4-hydroxybenzophenone, acrylate, methacrylate and combinations thereof were prepared similar to the steps in Examples 4–7.

Next, each derivative was formulated into a PSA by blending the terpolymer derivative in a 1.0:0.6:0.4 ratio with a tackifier blend comprising a 60/40 weight ratio of ECR-143H and ECR-111. The base terpolymer of the various derivatives comprised a para-methylstyrene/isobutylene copolymer having 2.4 mole percent para-methylstyrene, a Mooney viscosity of 32 and was blended with the tackifiers in a 30 wt % solids toluene solution. The composition of the terpolymer derivatives can be seen in Table A. Coatings (1.5 mil) on 1.5 mil thick MYLAR backings were prepared from the 30 wt % solids toluene solution of the terpolymer derivative. The coating samples were dried in a vacuum oven at room temperature for 24 hrs and then were crosslinked using EB or UV radiation under an inert atmosphere.

The terpolymer derivatives of Invention Examples A-3 and A-4 were observed to be thermally stable under typical handling and processing conditions, without the use of any thermal stabilizing additives, exhibiting no gellation upon storage at 80° C. under vacuum for a period of 72 hours. In addition, the terpolymer derivative of Example A-4 was masticated in a Brabender mixer at 60 rpm, initially at 130° C. for 30 minutes, and then at 150° C. for 60 minutes. As seen in the data shown graphically in FIGS. G and H, the functionalized copolymer exhibited excellent thermal stability and showed no sign of degradation or crosslinking over about the first hour of accelerated thermal history under a condition of shear.

Figure 3:
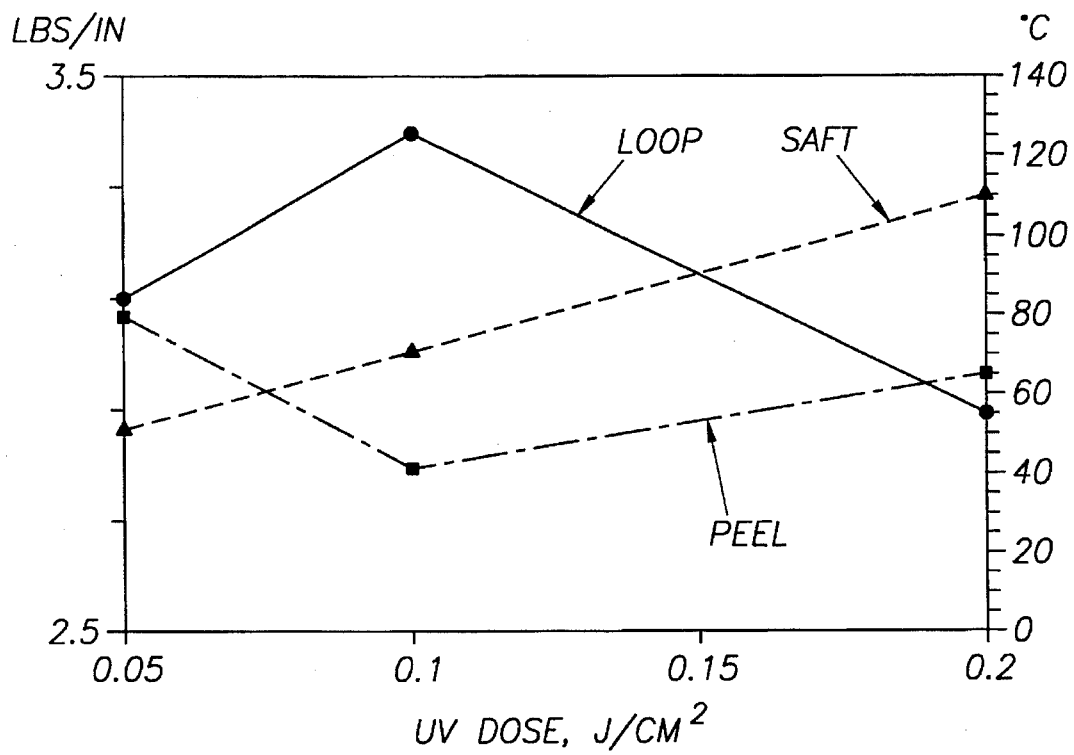
FIG. 3 is a graph of adhesive performance properties SAFT (°C.), 180° Peel (lbs/in.) and Loop Tack (lbs/in.) against UV dose (J/cm$^2$) for Example A-2 methacrylic acid functionalized terpolymer formulated with ECR-143H and ECR-111 tackifier.
Figure 4:
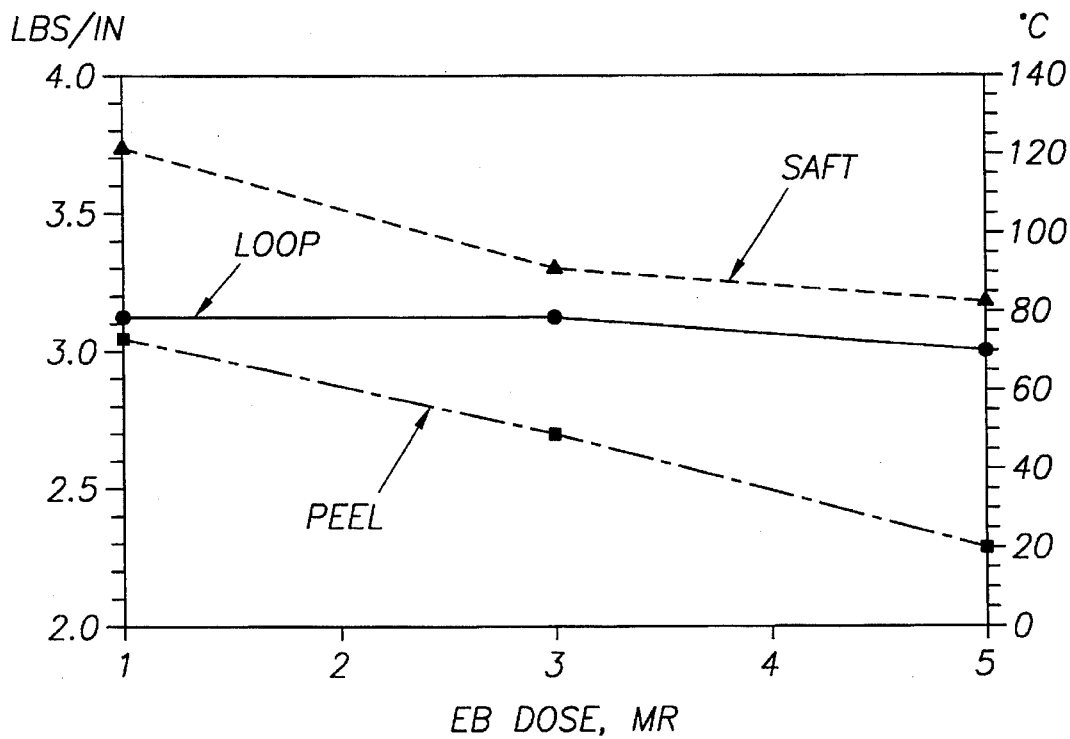
FIG. 4 is a graph of adhesive performance properties SAFT (°C.), 180° Peel (lbs/in.) and Loop Tack (lbs/in.) against EB dose (Mrad) for Example A-2 methacrylic acid functionalized terpolymer formulated with ECR-143H and ECR-111 tackifier.
Figure 5:
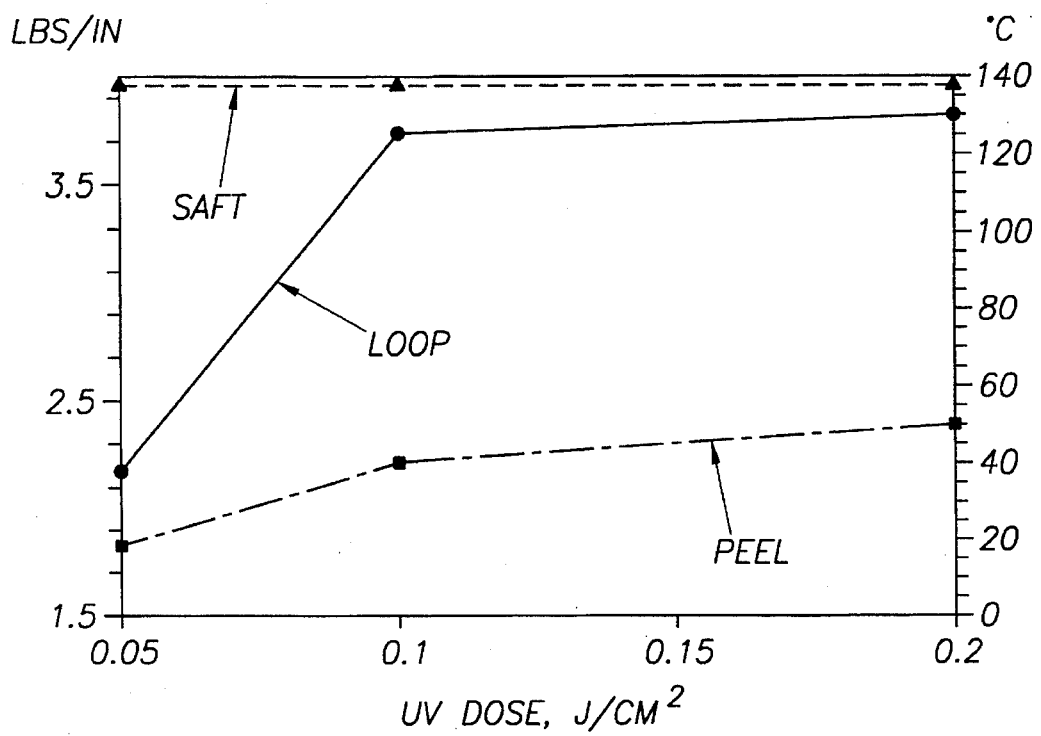
FIG. 5 is a graph of adhesive performance properties SAFT (°C.), 180° Peel (lbs/in.) and Loop Tack (lbs/in.) against UV dose (J/cm$^2$) for Example A-3 acrylic acid/benzophenone functionalized terpolymer formulated with ECR-143H and ECR-111 tackifier.
Figure 6:
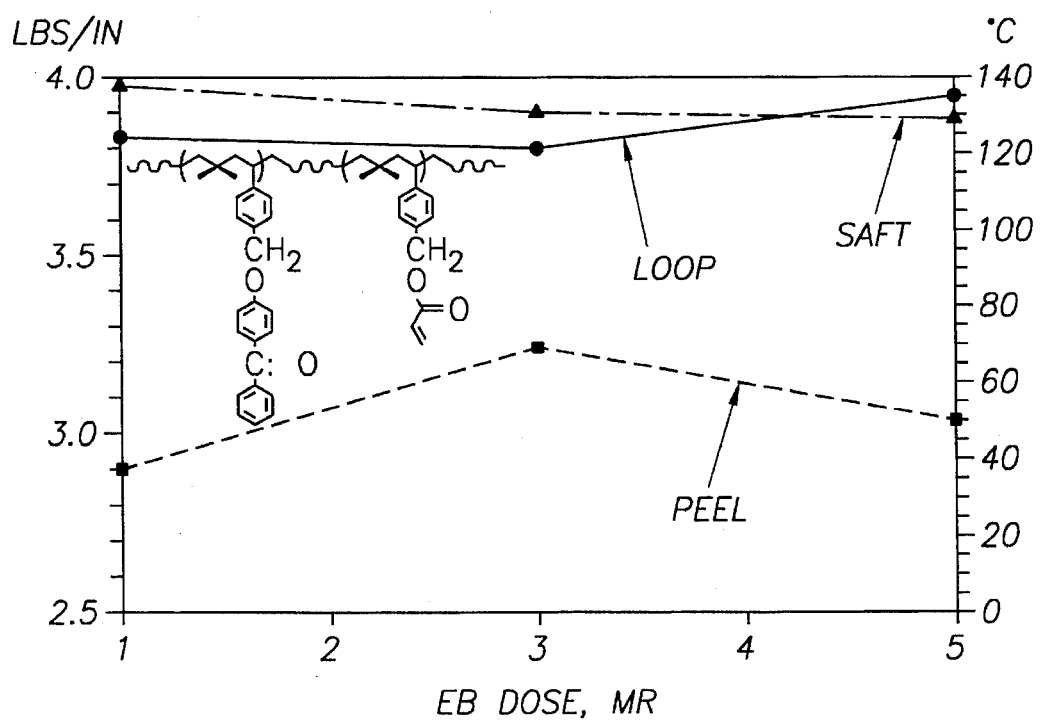
FIG. 6 is a graph of adhesive performance properties SAFT (°C.), 180° Peel (lbs/in.) and Loop Tack (lbs/in.) against EB dose (Mrad) for Example A-3 acrylic acid/benzophenone functionalized terpolymer formulated with ECR-143H and ECR-111 tackifier.
Figure 7:
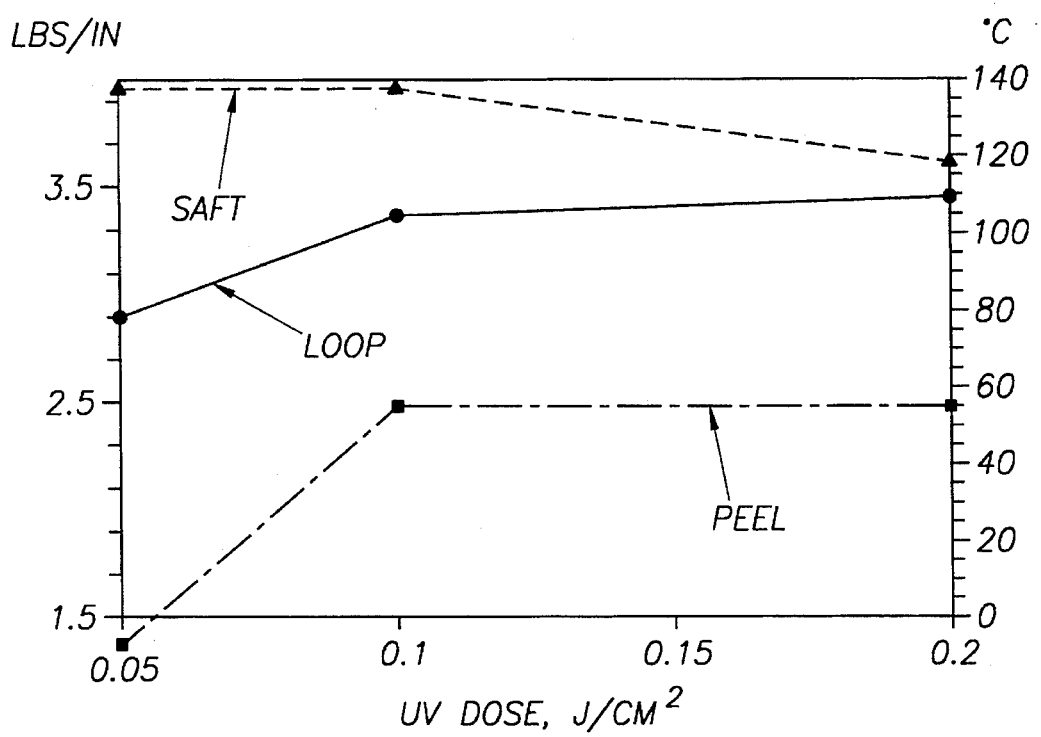
FIG. 7 is a graph of adhesive performance properties SAFT (°C.), 180° Peel (lbs/in.) and Loop Tack (lbs/in.) against UV dose (J/cm$^2$) for Example A-4 methacrylic acid/benzophenone functionalized terpolymer formulated with ECR-143H and ECR-111 tackifier.
Figure 8:
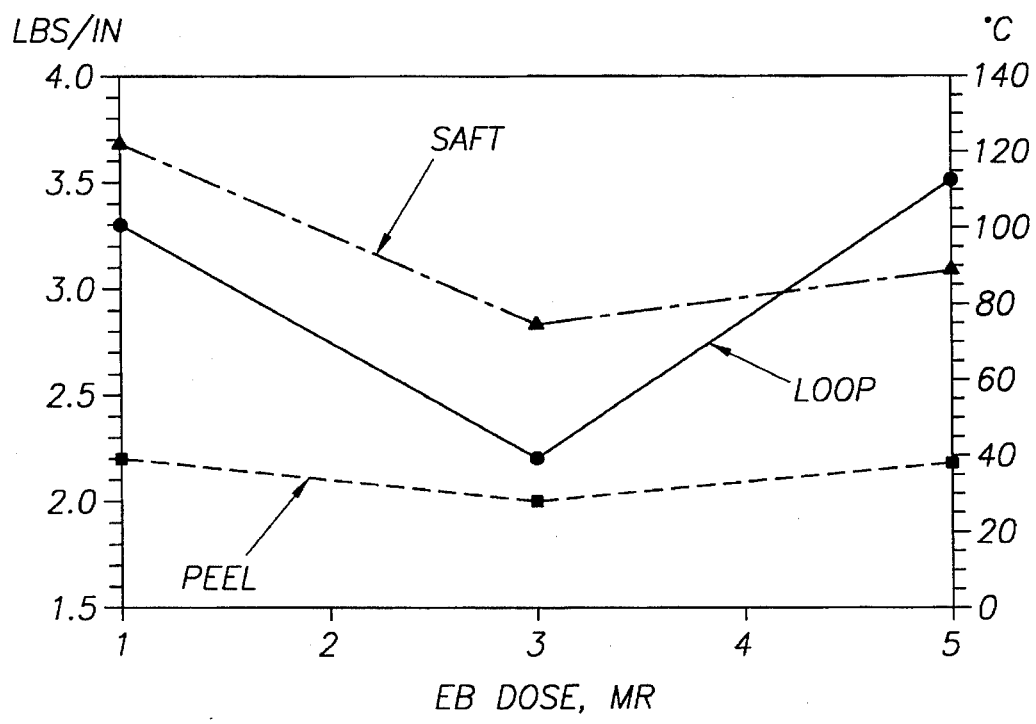
FIG. 8 is a graph of adhesive performance properties SAFT (°C.), 180° Peel (lbs/in.) and Loop Tack (lbs/in.) against EB dose (Mrad) for Example A-4 methacrylic acid/benzophenone functionalized terpolymer formulated with ECR-143H and ECR-111 tackifier.
Figure 9:
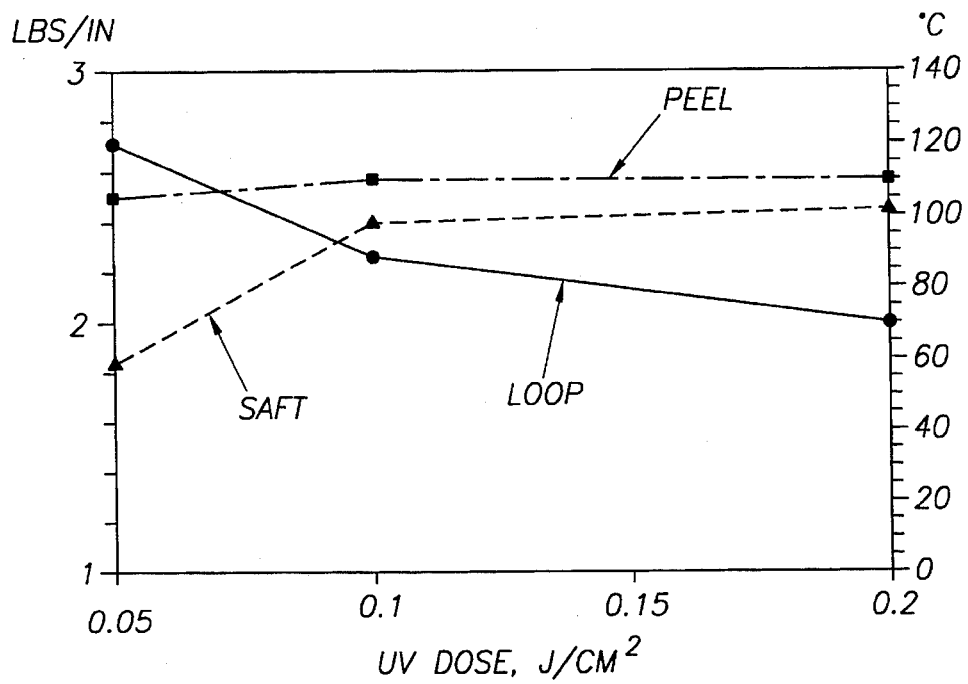
FIG. 9 is a graph of adhesive performance properties SAFT (°C.), 180° Peel (lbs/in.) and Loop Tack (lbs/in.) against EB dose (Mrad) for Example A-6 benzophenone functionalized terpolymer formulated with ECR-143H and ECR-111 tackifier.

Tests were conducted to determine the degree of gelation and adhesive/cohesive strength properties versus radiation dosage and terpolymer composition. Performance data are shown in Tables A-1 to A-7. Data from Tables A-1 to A-5 are shown graphically in FIGS. 1 to 9. Comparing FIGS. 1 through 4 and FIG. 9, it can be seen that the terpolymer derivative (Invention Example A-3) comprising both acrylate ester grafts and benzophenone photoinitiator grafts had a SAFT which was maximized at low UV dosage and maintained even when the radiation dosage was increased in comparison to the derivatives containing either acrylate or benzophenone grafts alone. Addition of the benzophenone tended to stabilize or increase the adhesive performance with increasing radiation dosage. Comparing FIGS. 5 through 8 and 9, it can be seen that the addition of benzophenone grafts to a methacrylate derivative terpolymer gave an adhesive having better overall performance at lower EB dosages and there was only a minimal tradeoff between SAFT and Peel with increasing UV dosages. Comparing FIGS. 3 and 7, addition of benzophenone grafts to either the acrylate or methacrylate terpolymer derivative gave an adhesive which generally had performance properties which increased with greater UV radiation dosage.

TABLE A-1

100 phr Example A-1
60 phr ECR-143H
40 phr ECR-111

| | PROPERTY | | | | | |
|---|---|---|---|---|---|---|
| | EB | | | UV | | |
| | DOSE | | | | | |
| | 1 Mr | 3 Mr | 5 Mr | 0.05 J/cm$^2$ | 0.1 J/cm$^2$ | 0.2 J/cm$^2$ |
| % GEL, FORMULATED | 29.8 | 32.0 | 44.5 | 40.1 | 31.3 | 32.1 |
| % GEL, POLYMER | 59.6 | 64.0 | 89.0 | 80.2 | 62.6 | 64.2 |
| 180° PEEL TO SS, lbs/in | 3.17 | 2.59 | 2.60 | 1.91 | 2.98 | 3.01 |
| LOOP TACK TO SS, lbs/in | 3.59 | 2.61 | 3.45 | 4.12 | 3.66 | 3.24 |
| HP, 1" × ½" × 1 kg, hours | 16.89 | 16.4 | 17.97 | 0.61 | 0.72 | 17.5 |
| SAFT, 1" × 1" × 1 kg | | | | | | |
| °F. | 280+ | 214 | 204 | 116 | 176 | 280+ |
| °C. | 138° | 101 | 96 | 48 | 80 | 138+ |

TABLE A-2

100 phr Example A-2
60 phr ECR-143H
40 phr ECR-111

| | PROPERTY | | | | | |
|---|---|---|---|---|---|---|
| | EB | | | UV | | |
| | DOSE | | | | | |
| | 1 Mr | 3 Mr | 5 Mr | 0.05 J/cm$^2$ | 0.1 J/cm$^2$ | 0.2 J/cm$^2$ |
| % GEL, FORMULATED | 43.1 | 40.6 | 44.8 | 28.4 | 36.9 | 35.7 |
| % GEL, POLYMER | 86.2 | 81.2 | 89.6 | 56.8 | 73.8 | 71.4 |
| 180° PEEL TO SS, lbs/in | 3.06 | 2.69 | 2.28 | 3.02 | 2.78 | 2.96 |
| LOOP TACK TO SS, lbs/in | 3.11 | 3.16 | 3.01 | 3.10 | 3.38 | 2.89 |
| HP, 1" × ½" × 1 kg, hours | 7.62 | 2.81 | 6.15 | 1.63 | 2.31 | 29.99 |
| SAFT, 1" × 1" × 1 kg | | | | | | |
| °F. | 252 | 199 | 181 | 125 | 158 | 234 |
| °C. | 122 | 93 | 83 | 52 | 70 | 112 |

TABLE A-3

100 phr Example A-3
60 phr ECR-143H
40 phr

| | PROPERTY | | | | | |
|---|---|---|---|---|---|---|
| | EB | | | UV | | |
| | DOSE | | | | | |
| | 1 Mr | 3 Mr | 5 Mr | 0.05 J/cm² | 0.1 J/cm² | 0.2 J/cm² |
| % GEL, FORMULATED | 33.5 | 34.3 | 41.1 | 38.3 | 44.9 | 41.6 |
| % GEL, POLYMER | 67.0 | 68.6 | 82.2 | 76.6 | 89.8 | 83.2 |
| 180° PEEL TO SS, lbs/in | 2.89 | 3.24 | 3.02 | 1.83 | 2.19 | 2.40 |
| LOOP TACK TO SS, lbs/in | 3.83 | 3.78 | 3.96 | 2.17 | 3.76 | 3.84 |
| HP, 1" × ½" × 1 kg, hours | 24.96 | 13.11 | 15.06 | 24.52 | 18.93 | — |
| SAFT, 1" × 1" × 1 kg | | | | | | |
| °F. | 280+ | 262 | 266 | 280+ | 280+ | 280+ |
| °C. | 138+ | 128 | 130 | 138+ | 138+ | 138+ |

TABLE A-4

100 phr Example A-4
60 phr ECR-143H
40 phr ECR-111

| | PROPERTY | | | | | |
|---|---|---|---|---|---|---|
| | EB | | | UV | | |
| | DOSE | | | | | |
| | 1 Mr | 3 Mr | 5 Mr | 0.05 J/cm² | 0.1 J/cm² | 0.2 J/cm² |
| % GEL, FORMULATED | 34.1 | 37.8 | 40.4 | 40.8 | 37.4 | 30.5 |
| % GEL, POLYMER | 68.2 | 75.6 | 80.8 | 81.6 | 74.8 | 61.0 |
| 180° PEEL TO SS, lbs/in | 2.21 | 1.97 | 2.19 | 1.38 | 2.46 | 2.51 |
| LOOP TACK TO SS, lbs/in | 3.31 | 2.17 | 3.51 | 2.88 | 3.35 | 3.43 |
| HP, 1" × ½" × 1 kg, hours | 7.78 | 7.88 | 16.1 | 19.89 | 16.68 | — |
| SAFT, 1" × 1" × 1 kg | | | | | | |
| °F. | 252 | 163 | 192 | 280+ | 280+ | 246 |
| °C. | 122 | 74 | 89 | 138+ | 138+ | 119 |

TABLE A-5

100 phr Example A-6
60 phr ECR-143H
40 phr ECR-111

| | PROPERTY UV DOSE | | |
|---|---|---|---|
| | 0.05 J/cm² | 0.1 J/cm² | 0.2 J/cm² |
| % GEL, FORMULATED | 72.1 | 38.6 | 34.5 |
| % GEL, POLYMER | — | 77.2 | 69.0 |
| 180° PEEL TO SS, lbs/in | 2.48 | 2.58 | 2.59 |
| LOOP TACK TO SS, lbs/in | 2.70 | 2.24 | 1.99 |
| HP, 1" × ½" × 1 kg, hours | 1.06 | 1.65 | — |
| SAFT, 1" × 1" × 1 kg | | | |
| °F. | 138 | 209 | 219 |
| °C. | 59 | 98 | 104 |

TABLE A-6

100 phr Example A-11
60 phr ECR-143H
40 phr ECR-111

| | PROPERTY | | | | | |
|---|---|---|---|---|---|---|
| | EB | | | UV | | |
| | | | | DOSE | | |
| | 1 Mr | 3 Mr | 5 Mr | 0.05 J/cm² | 0.1 J/cm² | 0.2 J/cm² |
| % GEL, FORMULATED | 0 | 0 | 0 | 31.8 | 48.0 | 62.3 |
| % GEL, POLYMER | 0 | 0 | 0 | 63.6 | 96.0 | — |
| 180° PEEL TO SS, lbs/in | 3.38 | 3.58 | 6.33 | 1.67 | 1.90 | 2.05 |
| LOOP TACK TO SS, lbs/in | 4.90 | 5.50 | 5.39 | 1.71 | 2.24 | 2.79 |
| HP, 1" × ½" × 1 kg, hours | 0.06 | 0.09 | 0.10 | 6.93 | — | 1.52 |
| SAFT, 1" × 1" × 1 kg | | | | | | |
| °F. | 111 | 98 | 97 | 178 | 218 | 195 |
| °C. | 43 | 37 | 36 | 81 | 103 | 91 |

TABLE A-7

100 phr Example A-8
60 phr ECR-143H
40 phr ECR-111

| | PROPERTY | | | | | |
|---|---|---|---|---|---|---|
| | EB | | | UV | | |
| | | | | DOSE | | |
| | 1 Mr | 3 Mr | 5 Mr | 0.05 J/cm² | 0.1 J/cm² | 0.2 J/cm² |
| % GEL, FORMULATED | 0 | 0 | 0 | 44.7 | 51.3 | 64.5 |
| % GEL, POLYMER | 0 | 0 | 0 | 89.4 | — | — |
| 180° PEEL TO SS, lbs/in | 2.59 | 2.97 | 4.31 (CF) | 1.93 | 2.01 | — |
| LOOP TACK TO SS, lbs/in | 2.93 | 5.45 | 4.90 | 2.24 | 2.25 | 2.58 |
| HP, 1" × ½" × 1 kg, hours | 0.43 | 0.15 | 0.09 | | | |
| SAFT, 1" × 1" × 1 kg | | | | | | |
| °F. | 120 | 103 | 98 | 235 | 209 | 207 |
| °C. | 49 | 39 | 37 | 113 | 98 | 97 |

Examples B-1 to B-4

In the following examples, the UV response of acrylate and methacrylate terpolymer derivatives containing 3 wt % IRGACURE 500 photoinitiator additive were compared to the same derivatives without the IRGACURE 500. IRGACURE 500 comprises 50 weight percent benzophenone, 50 weight percent 1-hydroxycyclohexanephenyl ketone, and is free of stabilizing compounds.

Figure 10:
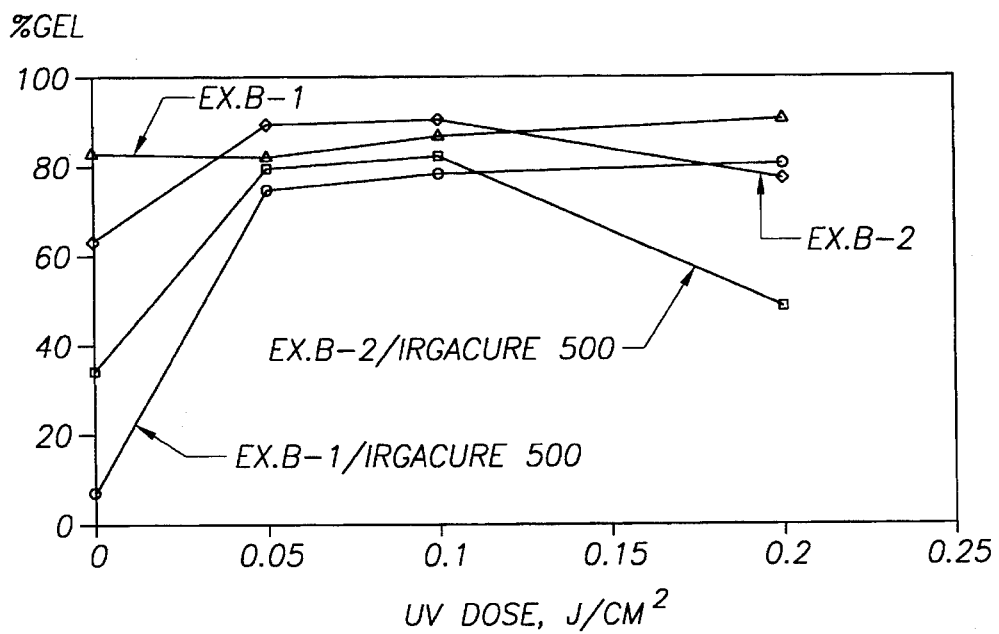
FIG. 10 is a graph comparing the UV gel response of unformulated Example B-1 and B-2 acrylic acid functionalized terpolymer derivatives with and without a benzophenone/1-hydroxycyclohexane phenyl ketone additive (IRGACURE 500).

Acrylate and methacrylate terpolymer derivatives were made similarly to Examples A-3–A-4 except that the base polymer (before bromination) comprised a para-methylstyrene/isobutylene copolymer having 7 mole % PMS (as determined by 400 MHz NMR) and a Mooney viscosity of 34. The acrylate derivative (Example B-1) comprised 4.5 mole % PMS, 0.3 mole % BrPMS and 3.5 mole % acrylate ester. The methacrylate derivative (Example B-2) comprised 4.2 mole % PMS, 0.40 mole % BrPMS and 3.1 mole % methacrylate ester. Coating samples (1.5 mil) were prepared on release paper backing above and irradiated with varying amounts of UV radiation. The percent gelation is plotted against UV dosage in FIG. 10. It can be seen that addition of benzophenone photoinitiator increased the thermal stability of the acrylate and methacrylate terpolymer derivatives without the use of an antioxidant such as BHT.

Invention Examples C-1 to C-2

In the following examples, the EB and UV gel response of various acrylate/benzophenone terpolymer derivatives was examined. Terpolymer derivative Examples A-1 through A-4 and A-6 (UV response only) absent the tackifier were coated (1.5 mil) on silicone release paper from a 30 wt % toluene solution and exposed to varying amounts of UV or EB radiation. The gelation response was determined by 48 h exhaustive reflux in a Soxhlet extractor using xylene solvent and the data are plotted in FIGS. 11 and 12. The terpolymer derivatives containing both benzophenone grafts and acrylate or methacrylate ester functionality gave the best gel response for either UV or EB radiation.

EXAMPLES D

Figure 13:
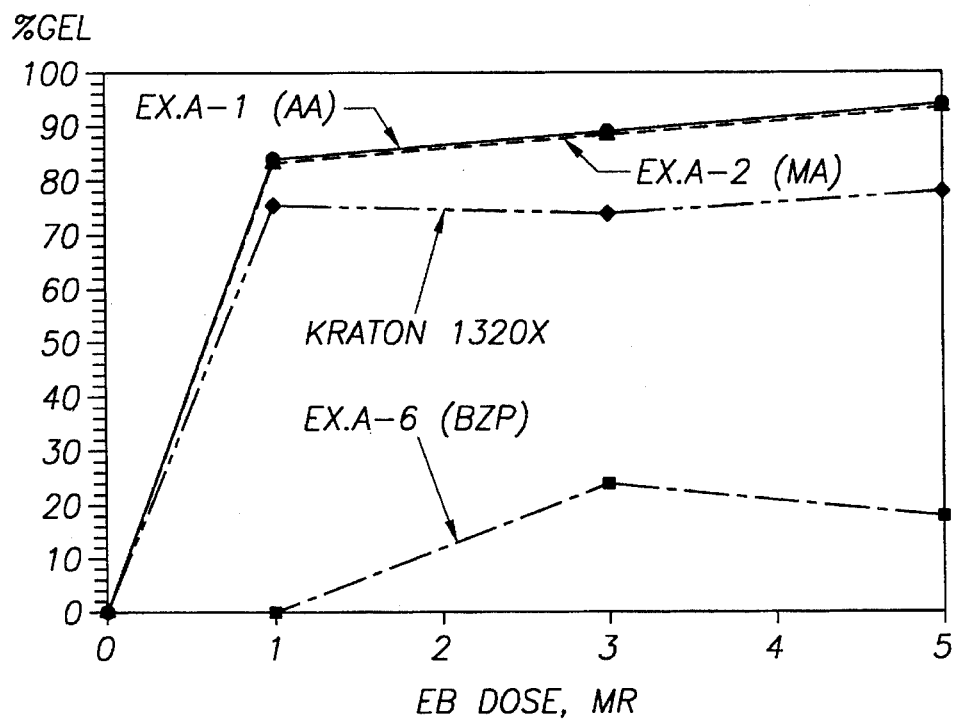
FIG. 13 is a graph comparing the EB gel response of Example A-1, A-2 and amine-quenched A-6 terpolymer derivatives to a Shell radiation curable KRATON 1320X block polymer.

In the following example, the EB gel response of terpolymer derivative Examples A-1, A-2 and amine-quenched A-6 were compared to the EB response of a Shell KRATON 1320X radiation curable block copolymer. Terpolymer derivative Examples A-1, A-2, and aminequenched A-6 absent the tackifier were coated (1.5 mil thickness) on silicone release paper from a 30 wt % toluene solution and exposed to varying amounts of EB radiation. Gelation response was determined by the method described in Example C-1 to C-2. The Example A-6 benzophenone terpolymer derivative was amine-quenched using an excess of diethanolamine solution in methanol. The data are plotted in FIG. 13. Results indicate that the present invention acrylate and methacrylate derivatives have a greater EB response than the KRATON 1320X block polymer or the amine-quenched terpolymer derivative.

Examples E-1 to E-7

Figure 14:
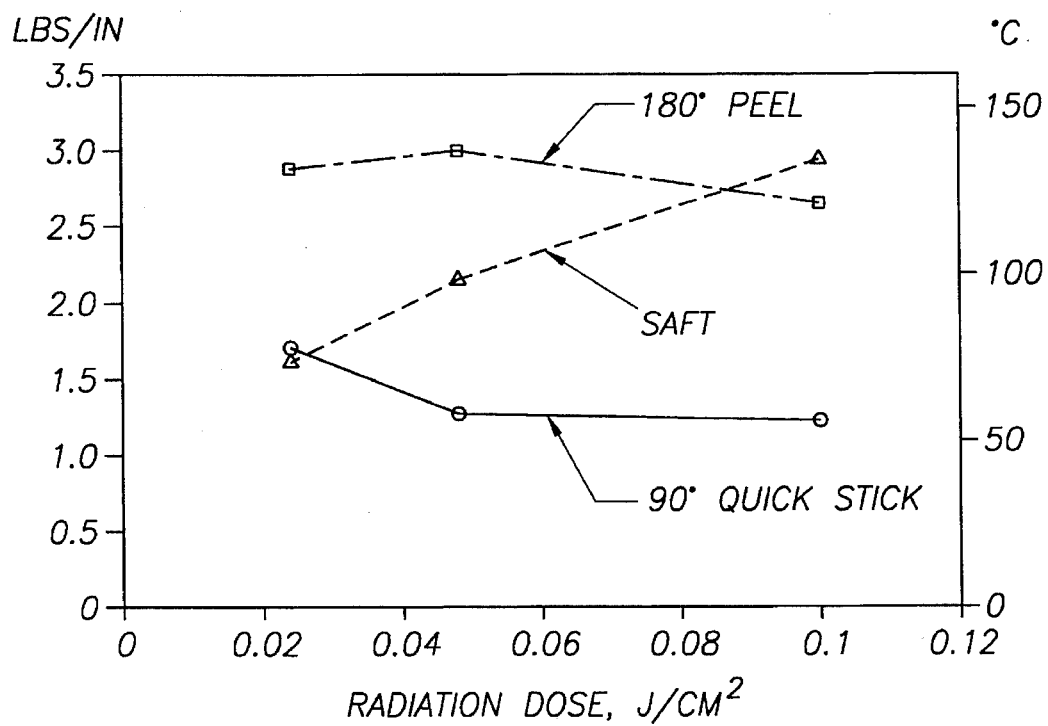
FIG. 14 is a graph of adhesive properties SAFT °F.), 180° Peel (lbs/in.) and 90° Quick Stick (lbs/in.) for an adhesive made from a 1:1 blend of Example A-5 acrylic acid/benzophenone functionalized terpolymer derivative and ECR-143H tackifier.
Figure 15:
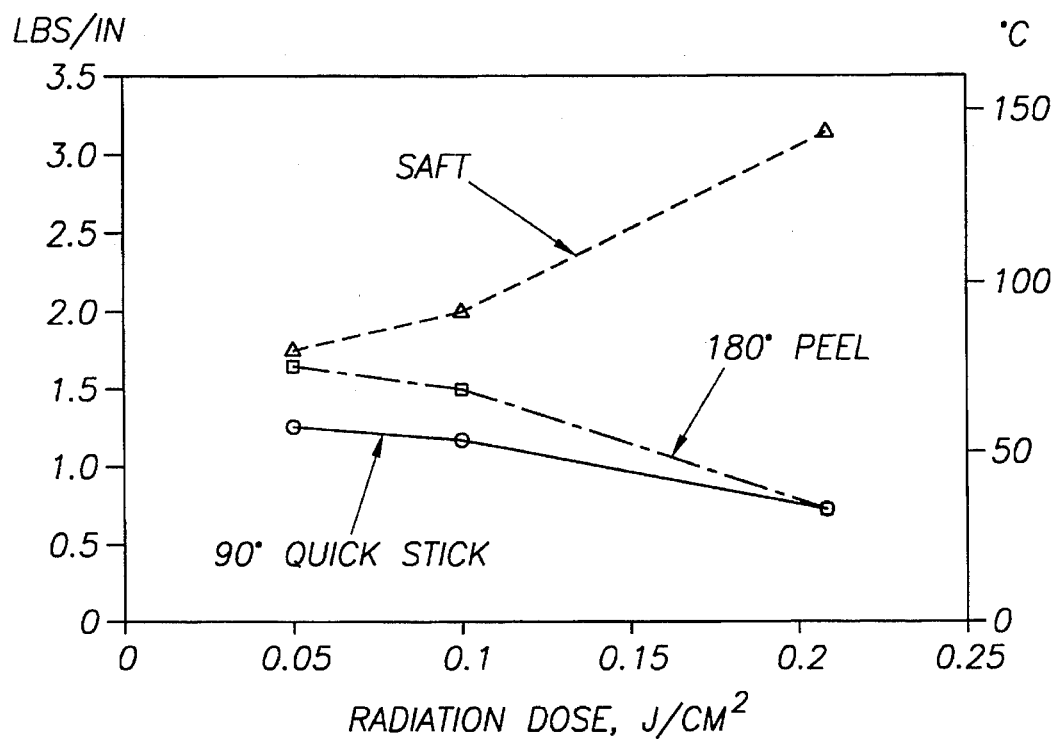
FIG. 15 is a graph of adhesive properties SAFT °F.), 180° Peel (lbs/in.) and 90° Quick Stick (lbs/in.) for an adhesive made from a 1.0:0.6:0.4 blend of Example A-5 acrylic acid/benzophenone functionalized terpolymer derivative and ECR-143H and ECR-111 tackifiers.
Figure 16:
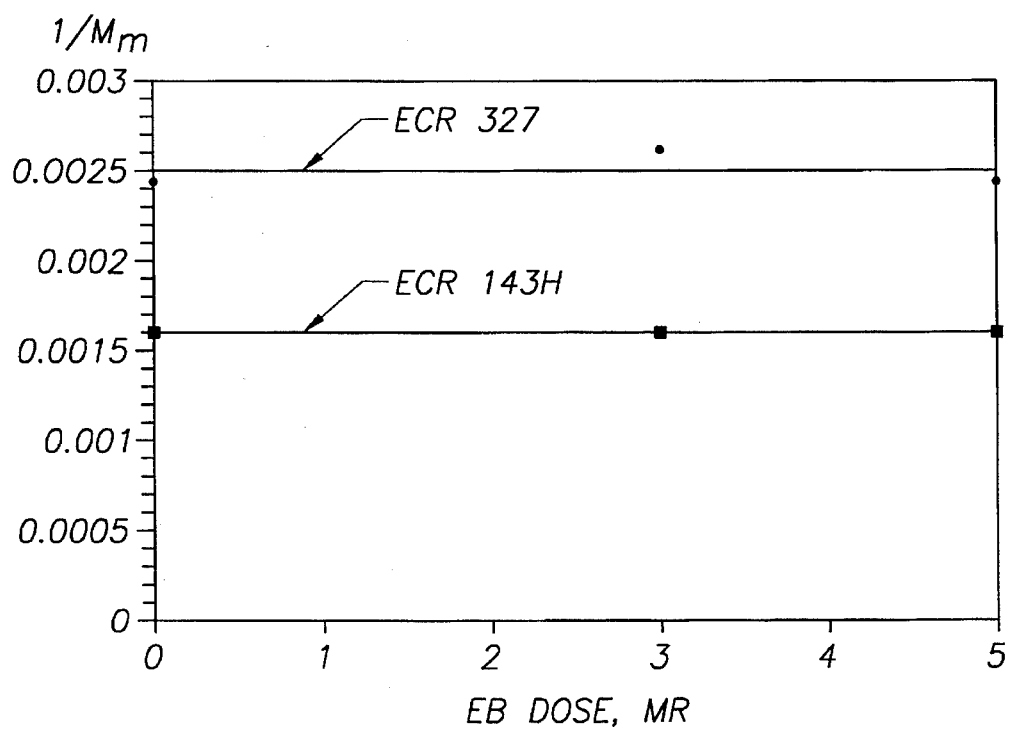
FIG. 16 graphically illustrates the EB inertness of ECR-327 and ECR-134H tackifiers employed in preferred adhesive blends of the present invention.
Figure 17:
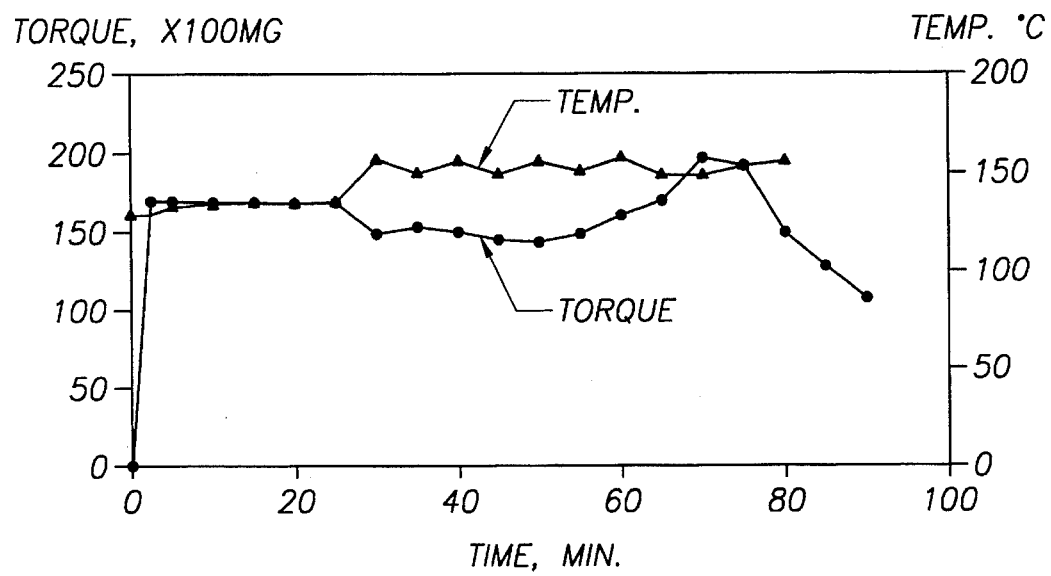
FIGS. 17 and 18 graphically illustrate the thermal stability of an unformulated and formulated, respectively, methacrylate/benzophenone functionalized copolymer of Example A-4 subjected to accelerated thermal history by mastication in a Brabender at elevated temperatures.
Figure 18:
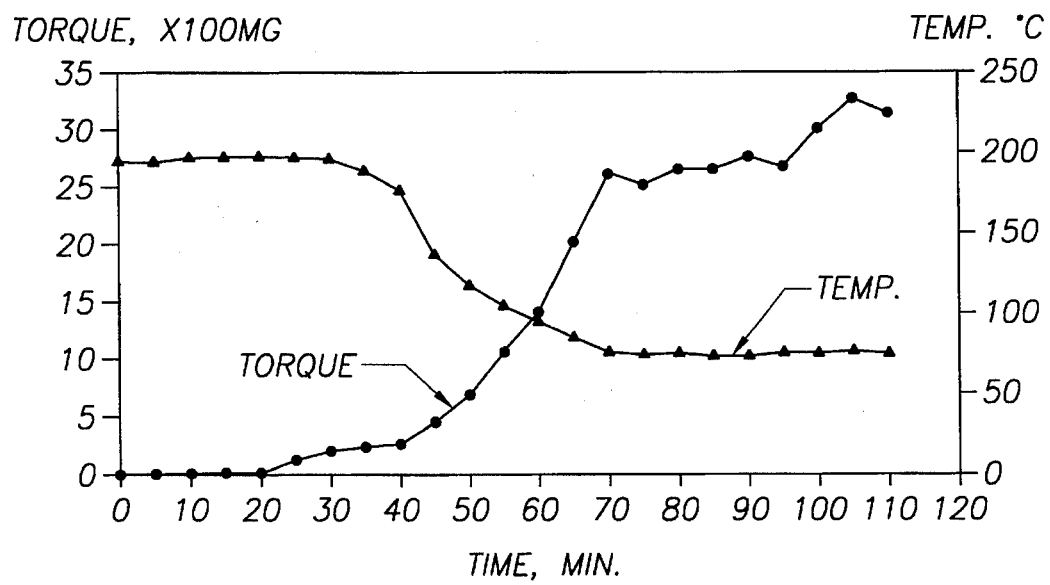

In the following examples, the effect of tackifier composition on the PSA performance was examined. The Example A-5 benzophenone terpolymer derivative was formulated into a PSA by blending in a 1:1 ratio with either the tackifier ECR-143H or a tackifier blend comprising a 60/40 weight ratio of ECR-143H and ECR-111. PSA sample coatings were prepared to a 1.5 mil thickness on MYLAR backing from a 30 wt % toluene solution, and exposed to varying amounts of UV radiation. As can be seen from Table E and corresponding FIGS. 14 and 15, adhesive performance was improved, especially the adhesive strength properties, by using the tackifier blend.

appended claims be embraced thereby.

What is claimed is:

1. A radiation curable functionalized copolymer comprising: an isoolefin of 4 to 7 carbon atoms and a para-alkylstyrene comonomer said copolymer having acrylate functionality grafted randomly onto at least 0.5 to 55 mole % of the para-alkyl groups of the copolymer and said copolymer has 1 ppm to 3 wt.%, based upon the weight of the copolymer, of photosensitive functionality randomly grafted onto a portion of the para-alkyl groups of the copolymer.

2. The polymer of claim 1, wherein the acrylate functionality is derived from an alpha, beta ethylenically unsaturated carboxylic acid from 3 to 8 carbon atoms.

3. The polymer of claim 1 wherein the acrylate is represented by the formula:

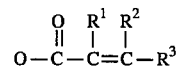

wherein $R^1$ and $R^2$ are independently hydrogen or a $C_1$ to $C_{20}$ alkyl, $R^3$ is hydrogen or a $C_1$ to $C_{20}$ alkyl or an unsaturated $C_1$ to $C_\omicron$alkyl.

4. The polymer of claim 1, wherein the acrylate is reepresented by the formula:

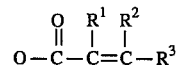

wherein $R^1$ and $R^2$ are independently hydrogen or a $C_1$ to $C_{10}$ alkyl; and $R^3$ is hydrogen or a $C_1$ to $C_{10}$ alkyl or an unsaturated $C_1$

TABLE E

| FORMULATION, phr | EXAMPLE E-1 | EXAMPLE E-2 | EXAMPLE E-3 | EXAMPLE E-4 | EXAMPLE E-5 | EXAMPLE E-6 | EXAMPLE E-7 |
|---|---|---|---|---|---|---|---|
| EXAMPLE A-5 | 100 | 100 | 100 | 100 | 100 | 100 | 100 |
| ECR-143H (a) | 100 | 100 | 100 | 60 | 60 | 60 | 60 |
| ECR-111 (b) | — | — | — | 40 | 40 | 40 | 40 |
| UV DOSE, J/cm² (c) | 0.05 | 0.10 | .020 | 0.025 | 0.05 | 0.1 | 0.2 |
| GEL, %/POLYMER (d) | 60 | 85 | 93 | 19 | 58 | 80 | 88 |
| 180° PEEL to SS, lbs/in | 1.5 | 1.3 | 1.4 | 2.9 | 3.0 | 2.8 | 2.4 |
| LOOP TACK to SS, psi | — | — | — | 1.7 | — | — | 1.1 |
| 90° QUICK STICK to SS, lbs/in | 1.2 | 1.1 | 0.7 | 1.6 | 1.3 | 1.3 | 1.4 |
| SHEAR ADHESION FAIL, °C. (e) | 75 | 141 | 129 | 70 | 100 | 136 | 89 |
| HOLDING POWER, hrs. (f) | 0.5 | 4.7 | 30+ | 1.7 | 15 | 76 | 30+ |

(a) Aliphatic Hydrogenated Resin, Tg - −25° C., S.P. - 18
(b) Aliphatic Hydrogenated Resin, Tg - +15° C., S.P. - 66
(c) Measured by EIT Radiometer
(d) Toluene Soxhlet Extraction, 48 hrs
(e) 1" × 1" × 1 kg
(f) 1" × ½ × 1 kg The foregoing description of the invention is illustrative and various modifications will become apparent to those skilled in the art in view thereof. It is intended that all such variations which fall within the scope and spirit of the to $C_{10}$ alkyl.

5. The polymer of claim 1, wherein the acrylate functionality comprises acryloyl or methacryloyl.

6. The polymer of claim 1, wherein the acrylate functionality is methacrylate.

7. The polymer of claim 1 wherein the photosensitive functionality is an aromatic ketone.

8. The polymer of claim 1, wherein the photosensitive functionality is 4-hydroxybenzophenone.

9. The polymer of claim 1, wherein the isoolefin is isobutylene.

10. A composition comprising the polymer of claim 1.

11. The composition of claim 10 further comprising one or more tackifiers.

12. The polymer of claim 1, wherein the para-alkylstyrene is para-methylstyrene.

13. The composition of claim 11, formed into a hot melt pressure-sensitive adhesive.

14. The composition of claim 10 formed into a sealant, a barrier, a coating, a negative resist, a film, a molded article or a membrane.

15. The polymer of claim 1 wherein said comonomer is represented by the formula:

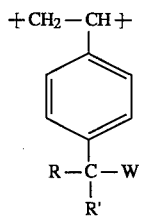

wherein R and R' are independently hydrogen, alkyl, primary alkyl halides, or secondary alkyl halides; and each W is independently a functional group selected from the group consisting of crosslinking functionality and photosensitive functionality, wherein the comonomer can be present at up to 50 mole %.

16. The polymer of claim 15 wherein W comprises up to about 95% acrylate and up to about 10% benzophenone.

17. The polymer of claim 15 wherein the photosensitive group is present at about 1 ppm to about 0.3 weight % based upon the copolymer and the acrylate is present at about 0.5 to about 55 mole %.

18. The polymer of claim 1 wherein the copolymer is thermally stable between about 80° and about 170° C.

19. The polymer of claim 1 further comprising a third functionality randomly grafted onto at least a portion of the para-alkyl groups.

20. A process for coating a copolymer onto a substrate surface comprising:

coating a substrate surface with a composition comprising a copolymer of claim 1; and exposing the coating to a radiation to crosslink the copolymer.

21. The process of claim 20 wherein the composition contains one or more tackifiers.

22. A composition comprising:

(a) the copolymer of claim 1;

(b) one or more elastomers; and (c) optionally, carbon black.

23. The composition of claim 22, wherein the elastomer(s) is selected form the group consisting of natural rubber, ethylene propylene rubber, ethylene propylene diene terpolymer, neoprene rubber nitrile rubber, butadiene rubber, Butyl rubber, chlorobutyl rubber, bromobutyl rubber, polyisobutylene rubber, isoprene rubber, acrylonitrile butadiene rubber, acrylonitrile chloroprene rubber, acrylonitrile isoprene rubber, styrene butadiene rubber, vinyl pyridene styrene butadiene rubber, styrene butadiene styrene block copolymer, styrene chloroprene rubber and styrene isoprene rubber.

24. The composition of claim 22 wherein the copolymer of claim 1 is present at up to about 15 phr.

25. The composition of claim 22 formed into an article.

26. A composition comprising:

(a) the copolymer of claim 1;

(b) one or more elastomers; and (c) one or more plastic polymers selected from the group consisting of homopolymers and copolymers of ethylene, propylene and styrene; wherein the comonomer is present in the plastic polymer at up to about 10 weight percent, based upon the weight of the composition.

27. The composition of claim 26 wherein the copolymer of claim 1 is present up to about 15 phr.

28. The composition of claim 26 formed into an article.

29. The composition of claim 25 or 28 further cured by radiation.

30. A process for curing elastomers and elastomer blends comprising:

(a) blending the copolymer of claim 1; with (b) one or more elastomers; and (c) subsequently exposing the blend to radiation.

31. The process of claim 30, wherein the blend is formed into an article.

32. The process of claim 30, wherein the blend is exposed to ultraviolet or electron beam radiation.

33. The composition of claim 26, wherein the plastic polymer is present at less than about 20 weight percent, based upon the weight of the composition.

34. The copolymer of claim 19, wherein the third functionality is an amine.

35. A composition comprising two or more copolymers as defined by claim 1, wherein each copolymer has an acrylate or photosensitive functional group that differs from the other copolymers.

36. A radiation curable functionalized blend, comprising:

a copolymer of an isoolefin of 4 to 7 carbon atoms and a para-alkylstyrene comonomer said copolymer having acrylate functionality grafted randomly onto at least 0.5 to 55 mole% of the para-alkyl groups of the copolymer, and wherein the acrylate is represented by the formula:

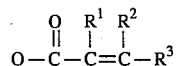

wherein $R^1$ and $R^2$ are independently hydrogen or a $C_1$ to $C_{20}$ alkyl, $R^3$ is hydrogen or a $C_1$ to $C_{20}$ alkyl or an unsaturated $C_1$ to $C_{20}$ alkyl; and blended with 1 ppm to 3 wt. %, based upon the weight of the copolymer, of photosensitive functionality.

* * * * *